(12) United States Patent
Hsiung et al.

(10) Patent No.: US 12,136,650 B2
(45) Date of Patent: Nov. 5, 2024

(54) HIGH VOLTAGE DEVICE AND MANUFACTURING METHOD THEREOF

(71) Applicant: Richtek Technology Corporation, Zhubei (TW)

(72) Inventors: Chih-Wen Hsiung, Hsinchu (TW); Chun-Lung Chang, Yilan (TW); Kun-Huang Yu, Hsinchu (TW); Kuo-Chin Chiu, Hsinchu (TW); Wu-Te Weng, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 452 days.

(21) Appl. No.: 17/718,101

(22) Filed: Apr. 11, 2022

(65) Prior Publication Data

US 2022/0336588 A1 Oct. 20, 2022

(30) Foreign Application Priority Data

Apr. 19, 2021 (TW) .................................. 110113963

(51) Int. Cl.
*H01L 29/78* (2006.01)
*H01L 21/74* (2006.01)
*H01L 29/06* (2006.01)
*H01L 29/10* (2006.01)
*H01L 29/66* (2006.01)

(52) U.S. Cl.
CPC ........ *H01L 29/1087* (2013.01); *H01L 21/743* (2013.01); *H01L 29/0653* (2013.01); *H01L 29/1095* (2013.01); *H01L 29/66681* (2013.01); *H01L 29/7816* (2013.01)

(58) Field of Classification Search
CPC .......... H01L 29/1095; H01L 29/66681; H01L 29/7816
See application file for complete search history.

(56) References Cited

U.S. PATENT DOCUMENTS

| | | | |
|---|---|---|---|
| 2013/0040432 A1 | 2/2013 | Jung | |
| 2015/0162440 A1* | 6/2015 | Ikuta | ................... H01L 29/0878 257/343 |
| 2019/0237576 A1* | 8/2019 | Qiao | ................... H01L 29/4236 |
| 2020/0105926 A1 | 4/2020 | Huang et al. | |

* cited by examiner

*Primary Examiner* — Michele Fan
(74) *Attorney, Agent, or Firm* — Tung & Associates

(57) ABSTRACT

A high voltage device includes: a semiconductor layer, a well, a body region, a body contact, a gate, a source, and a drain. The body contact is configured as an electrical contact of the body region. The body contact and the source overlap with each other to define an overlap region. The body contact has a depth from an upper surface of the semiconductor layer, wherein the depth is deeper than a depth of the source, whereby a part of the body contact is located vertically below the overlap region. A length of the overlap region in a channel direction is not shorter than a predetermined length, so as to suppress a parasitic bipolar junction transistor from being turning on when the high voltage device operates, wherein the parasitic bipolar junction transistor is formed by a part of the well, a part of the body region and a part of the source.

12 Claims, 18 Drawing Sheets

HIGH VOLTAGE DEVICE AND MANUFACTURING METHOD THEREOF

CROSS REFERENCE

The present invention claims priority to TW 110113963, filed on Apr. 19, 2021.

BACKGROUND OF THE INVENTION

Field of Invention

The present invention relates to a high voltage device and a manufacturing method thereof; particularly, it relates to such high voltage device which is capable of suppressing a parasitic transistor from being turned ON and a manufacturing method thereof.

Description of Related Art

FIGS. 1A and 1B illustrate a cross-sectional diagram and a top-view diagram of a conventional high voltage device 100, respectively. The so-called high voltage device herein refers to a semiconductor device with a drain to which a voltage higher than a voltage level, such as 5V, is applied under normal operation. Generally, taking the high voltage device 100 shown in FIGS. 1A and 1B as an example, a drift region 12a (as shown by the dashed-line region in FIG. 1A) is formed between a drain 19 and a body region 16 of the high voltage device 100 to separate the drain 19 from the body region 16. The lateral length of the drift region 12a can be determined according to the operation voltage that the device is designed to withstand under normal operation. As shown in FIGS. 1A and 1B, the high voltage device 100 includes: a well 12, a body contact 13, a drift oxide region 14, the body region 16, a gate 17, a source 18 and the drain 19. The well 12 has an N conductivity type and is formed above a substrate 11. As shown in FIG. 1A, a part of the gate 17 is formed above the drift region 12a and covers a part of the drift oxide region 14. The body contact 13 and the body region 16 have a P conductivity type. The source 18 and the drain 19 have the N conductivity type.

Generally, when the high voltage device 100 is formed, plural device units are formed concurrently in a mirror arrangement, wherein two adjacent device units share the same body region 16 and the same body contact 13. Therefore, as shown in FIGS. 1A and 1B, the source 18' (of another high voltage device) is mirror-symmetric to the source 18; the gate 17' (of said another high voltage device) is mirror-symmetric to the gate 17, and so on.

When the high voltage device 100 operates, a high electronic field will generate hot carriers, and electric holes of the hot carriers are injected to the body contact 13 via the body region 16 to form a hot carriers current. When the hot carriers current flows through the body region 16, the voltage drop in the body region 16 increases, which can turn ON a parasitic NPN bipolar junction transistor (BJT) which is formed by the source 18, the body region 16, and the well 12, to generate a large conduction current which may damage the high voltage device 100, and as thus the safe operation area (SOA) of the device is limited. "SOA" is well known by those skilled in the art, so details thereof are not explained here.

In view of the above, the present invention proposes a high voltage device and a method for manufacturing the high voltage device which can surppress the parasitic bipolar junction transistor from being turned on when the high voltage device operates, to increase the SOA.

SUMMARY OF THE INVENTION

In one aspect, the present invention provides a high voltage device, comprising: a semiconductor layer, which is formed on a substrate; a well, which has a first conductivity type, and is formed in the semiconductor layer; a body region, which has a second conductivity type, and is formed in the well; a body contact, which has the second conductivity type, and is configured to operably serve as an electrical contact of the body region, wherein the body contact is formed in the body region; a gate, which is formed on the semiconductor layer, wherein a part of the body region is located vertically beneath and in contact with the gate, so as to provide an inversion current channel during an ON operation of the high voltage device; a source, which has the first conductivity type, and is formed in the body region, wherein the source is located below the gate and out of one side of the gate; and a drain, which has the first conductivity type, and is formed in the well, wherein the drain is located below the gate at another side of the gate away from the body region, wherein a drift region is located between the drain and the body region in a channel direction and the drift region serves as a drift current channel during the ON operation of the high voltage device; wherein a region where the body contact and the source overlaps with each other is defined as an overlap region, wherein the overlap region has the first conductivity type; wherein the body contact has a depth extending downward from an upper surface of the semiconductor layer, wherein the depth is deeper than a depth of the source extending downward from the upper surface of the semiconductor layer, so that a part of the body contact is located vertically below the overlap region; wherein a length of the overlap region in the channel direction is not shorter than a predetermined length, so as to suppress a parasitic bipolar junction transistor from being turned on when the high voltage device operates; wherein the parasitic bipolar junction transistor is formed by a part of the well, a part of the body region and a part of the source; wherein a concentration of the second conductivity type impurities of the body contact is higher than a concentration of the second conductivity type impurities of the body region.

In another aspect, the present invention provides a method for manufacturing a high voltage device, the method comprising: forming a semiconductor layer on a substrate; forming a well having a first conductivity type in the semiconductor layer; forming a body region having a second conductivity type in the well; forming a body contact having the second conductivity type in the body region, wherein the body contact is configured to operably serve as an electrical contact of the body region; forming a gate on the semiconductor layer, wherein a part of the body region is located vertically beneath and in contact with the gate, so as to provide an inversion current channel during an ON operation of the high voltage device; forming a source having the first conductivity type in the body region, wherein the source is located below the gate and out of one side of the gate; and forming a drain having the first conductivity type in the well, wherein the drain is located below the gate at another side of the gate away from the body region, wherein a drift region is located between the drain and the body region in a channel direction and the drift region serves as a drift current channel during the ON operation of the high voltage device; wherein a region where the body contact and the source overlaps with each other is defined as an overlap region, wherein the overlap region has the first conductivity type; wherein the body contact has a depth extending downward from an upper surface of the semiconductor layer, wherein the depth is deeper than a depth of the source extending downward from the upper surface of the semiconductor layer, so that a part of the body contact is located vertically below the overlap region; wherein a length of the overlap region in the channel direction is not shorter than a predetermined length, so as to suppress a parasitic bipolar junction transistor from being turned on when the high voltage device operates; wherein the parasitic bipolar junction transistor is formed by a part of the well, a part of the body region and a part of the source; wherein a concentration of the second conductivity type impurities of the body contact is higher than a concentration of the second conductivity type impurities of the body region.

In one preferable embodiment, the high voltage device further comprising a drift oxide region, which is formed above the upper surface and is in contact with the upper surface, and the drift oxide region is located above the drift region and in contact with the drift region, wherein the drift oxide region includes a local oxidation of silicon (LOCOS) structure, a shallow trench isolation (STI) structure, or a chemical vapor deposition (CVD) oxide region.

In one preferable embodiment, the first conductivity type is opposite to the second conductivity type.

In one preferable embodiment, the gate and the overlap region both extend in a width direction and are parallel with each other.

In one preferable embodiment, the source is a single continuous region, whereas, the body contact includes plural separated sub-regions, wherein in the semiconductor layer beneath the upper surface, the plural sub-regions are separated from each other by the source, and each sub-region is surrounded by the source.

In one preferable embodiment, the body contact includes plural separated sub-regions, wherein in the semiconductor layer beneath the upper surface, the plural sub-regions are separated from each other by the source, and a part of the overlap region is located right below a spacer layer of the gate.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, but the shapes, thicknesses, and widths are not drawn in actual scale.

Figure 1A:
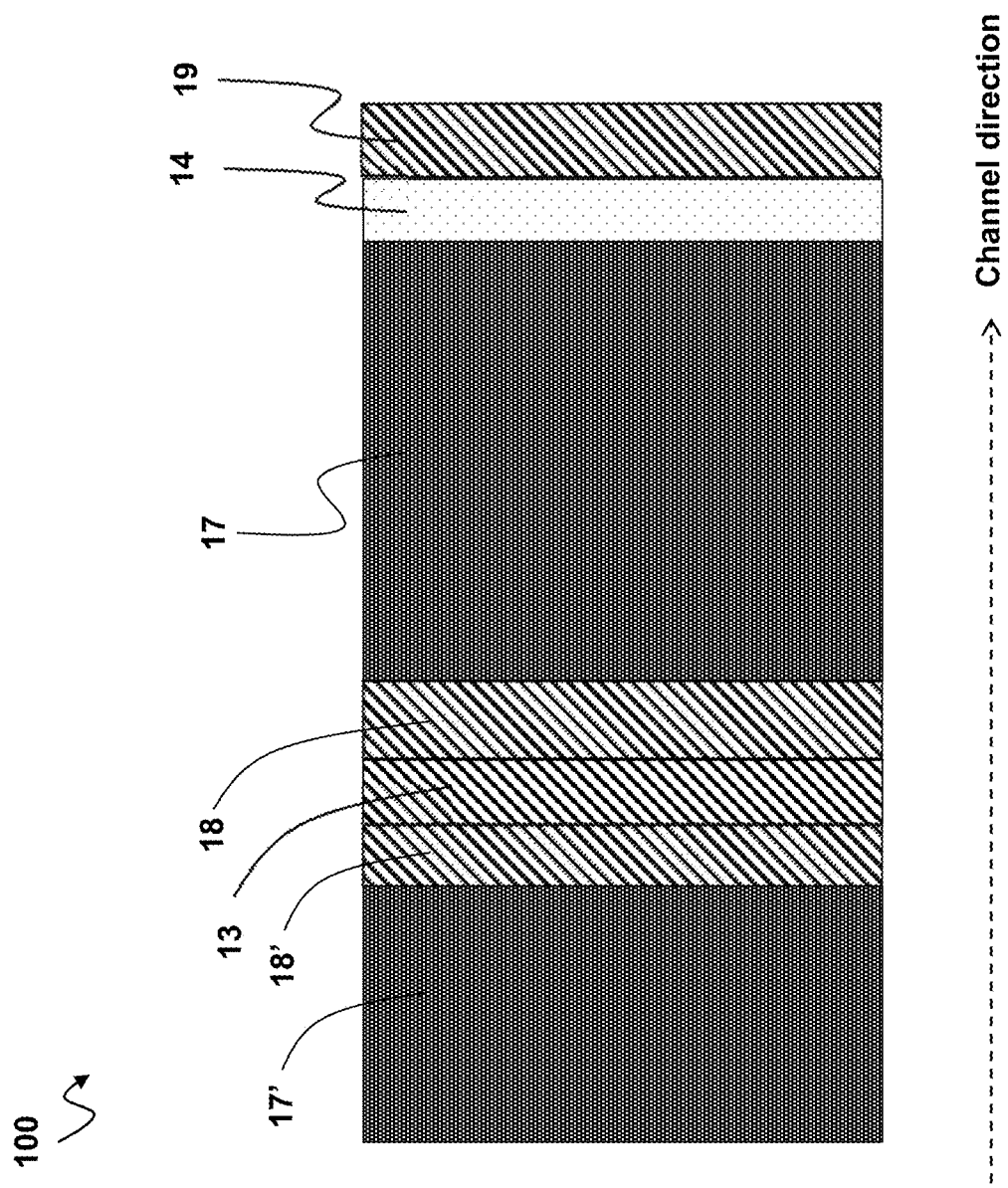
FIGS. 1A and 1B illustrate a top view diagram and a cross-sectional diagram of a conventional high voltage device 100, respectively.
Figure 1B:
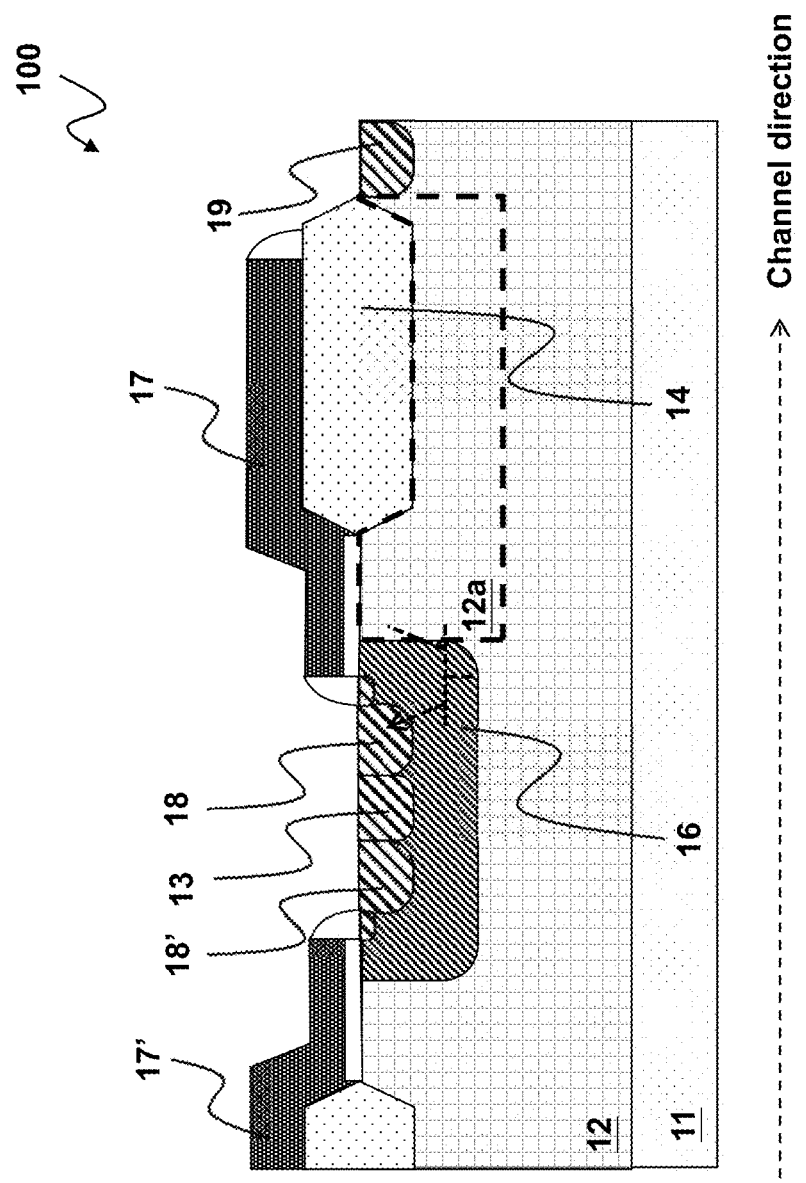
Figure 2A:
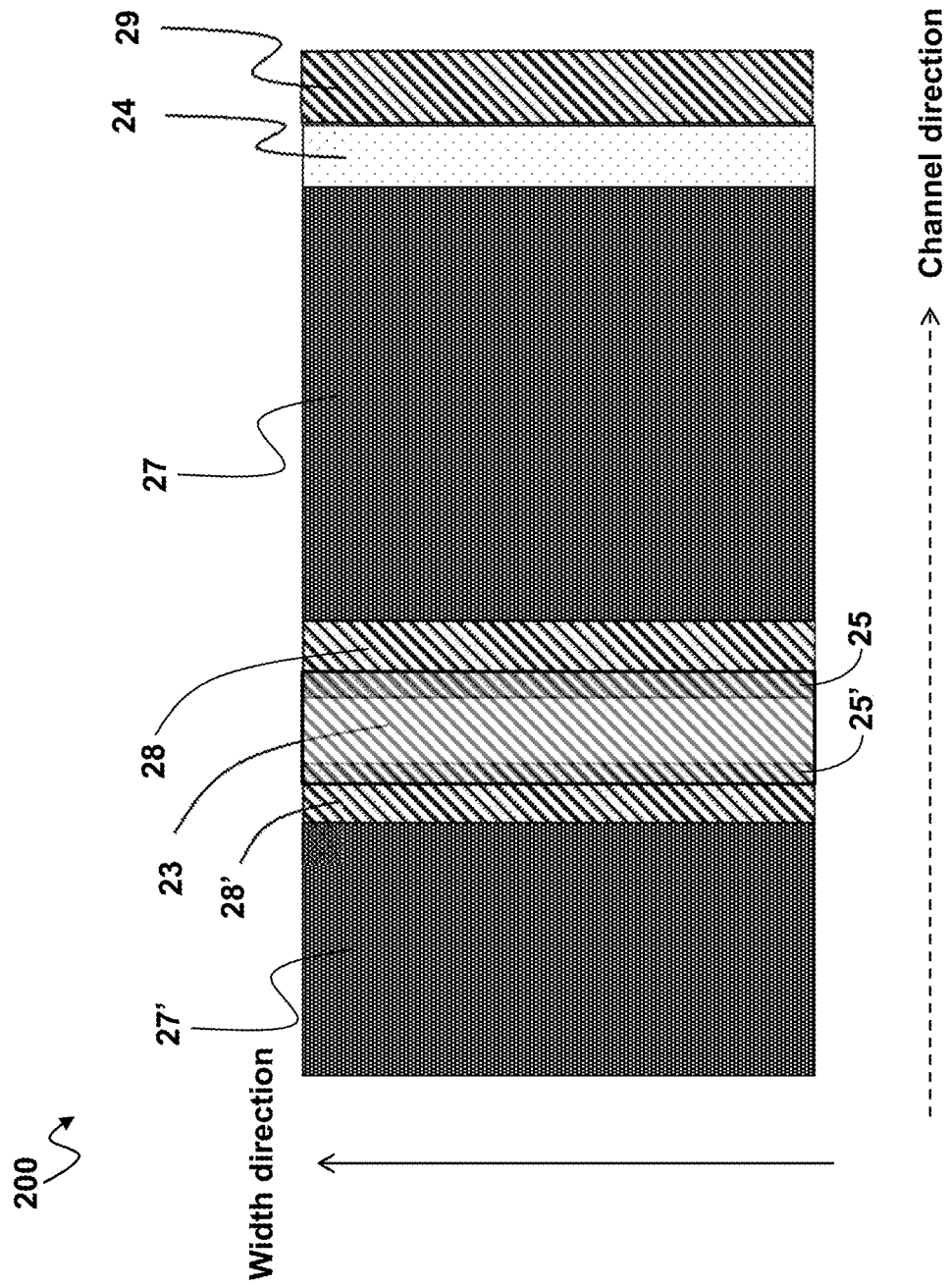
FIGS. 2A-2C show a first embodiment of the present invention.
Figure 2B:
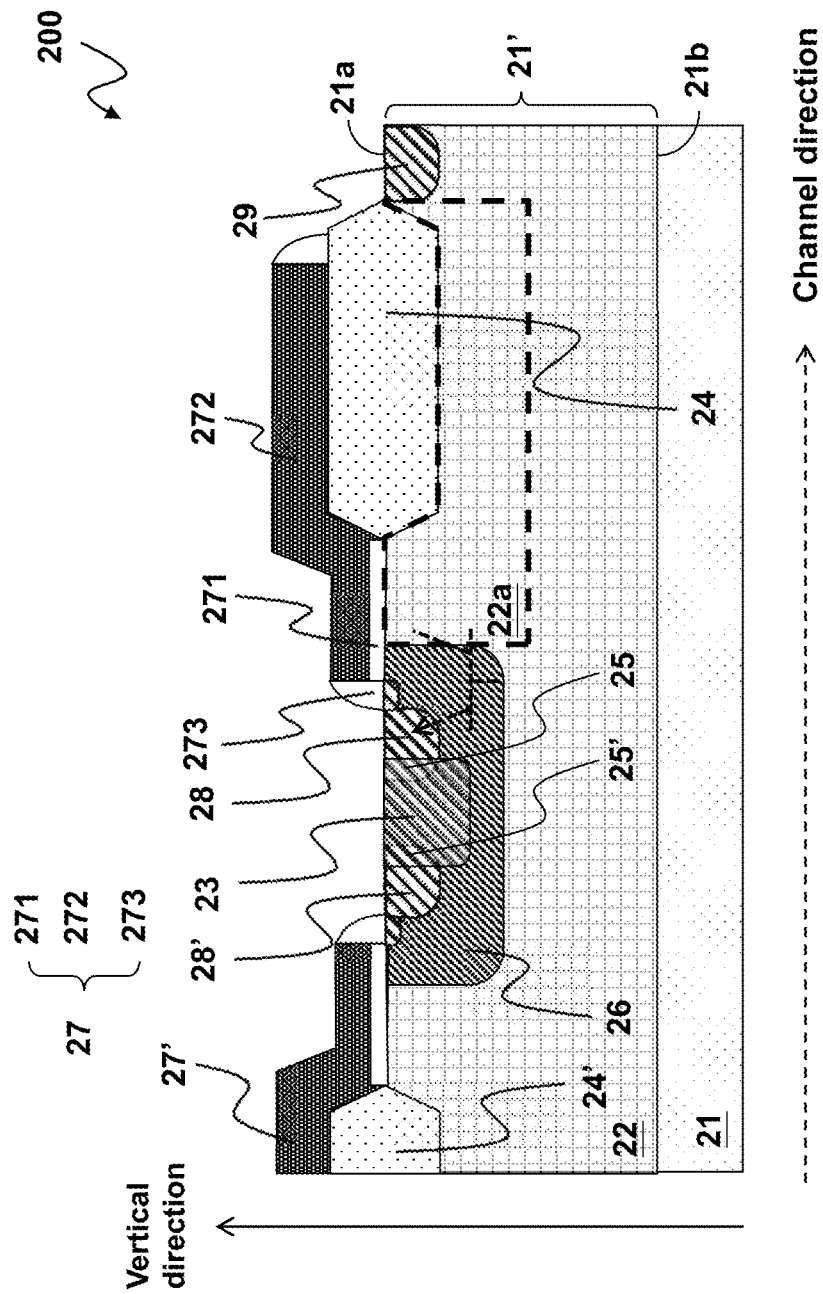
Figure 2C:
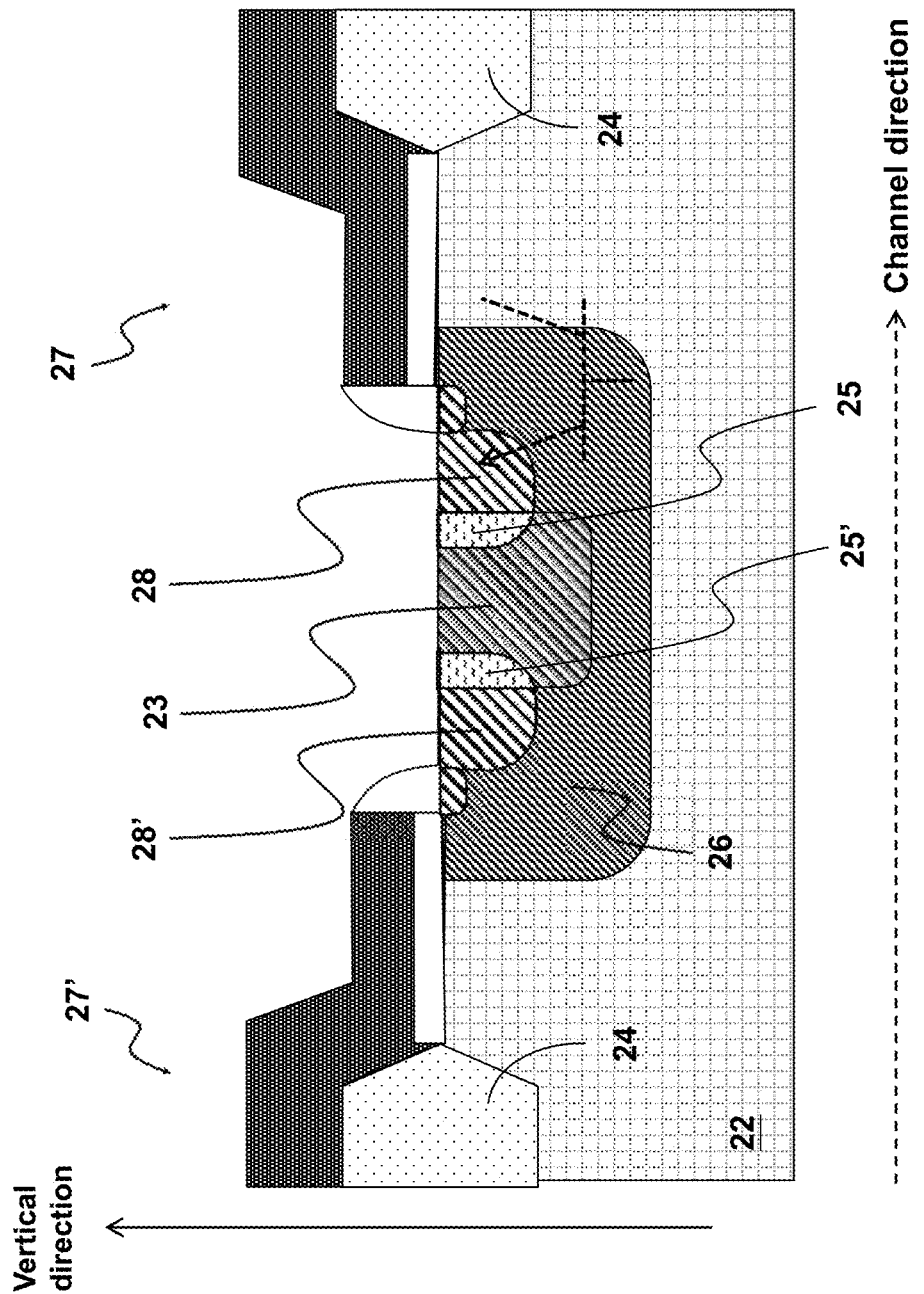

Please refer to FIGS. 2A-2C, which show a first embodiment of the present invention. FIGS. 2A, 2B, and 2C show a top view diagram, a cross-sectional diagram, and a partial cross-sectional diagram of a high voltage device 200 in accordance with one embodiment of the present invention. The high voltage device 200 includes a semiconductor layer 21', a well 22, a body contact 23, a drift oxide region 24, a body region 26, a gate 27, a source 28 and a drain 29. When the high voltage device 200 is formed, plural device units are formed concurrently in a mirror arrangement, wherein two adjacent device units share the same body region 26 and body contact 23. As shown in FIGS. 2A and 2B, the source 28' is mirror-symmetric to the source 28, the gate 27' is mirror-symmetric to the gate 27, the drift oxide region 24' is mirror-symmetric to the drift oxide region 24, and so on.

The semiconductor layer 21' is formed on the substrate 21. The semiconductor layer 21' has a top surface 21a and a bottom surface 21b opposite to the top surface 21a in a vertical direction (as indicated by the direction of the solid arrow in FIGS. 2B and 2C). The substrate 21 is, for example but not limited to, a P-type or N-type semiconductor substrate. The semiconductor layer 21', for example, is formed on the substrate 21 by an epitaxial process step, or is a part of the substrate 21. The semiconductor layer 21' can be formed by various methods known to a person having ordinary skill in the art, so the details thereof are not redundantly explained here.

Still referring to FIGS. 2A-2C, the drift oxide region 24 is formed on and in contact with the top survice 21a and is located above the drift region 22a (as indicated by the dashed-line frame in FIG. 2A). In one embodiment, the drift oxide region 24 is, for example but not limited to, the local oxidation of silicon (LOCOS) structure shown in FIGS. 2B and 2C; in another embodiment, it can be a shallow trench isolation (STI) structure or a chemical vapor deposition (CVD) oxide region. Manufacturing methods of the LOCOS structure, the STI structure, and the CVD oxide region are well known by those skilled in the art, so details thereof are omitted here.

The well 22 has the first conductivity type, and is formed in the semiconductor layer 21'. The well 22 is located beneath and in contact with the top surface 21a in the vertical direction. The body region 26 has a second conductivity type, and is formed in the well 22. The body region 26 is located beneath and in contact with the top surface 21a in the vertical direction. The body contact 23 is formed in the body region 26, and has the second conductivity type. The body contact 23 is configured as an electrical contact of the body region 26. The body contact 23 is located beneath and in contact with the top surface 21a in the vertical direction. The gate 27 is formed on the top surface 21a of the semiconductor layer 21'. The gate 27 is substantially a rectangular shape which extends along a width direction (as indicated by the direction of the solid arrow in FIG. 2A) when viewed from the top view. A part of the body region 26 is located vertically below the gate 27 and is in contact with the gate 27 in the vertical direction, so as to provide an inversion current channel in the ON operation of the high voltage device 200. The concentration of the second conductivity type impurities of the body contact 23 is higher than the concentration of the second conductivity type impurities of the body region 26.

Still referring to FIGS. 2A-2C, the source 28 and the drain 29 have the first conductivity type. The source 28 and the drain 29 are formed beneath the top surface 21a and in contact with the top surface 21a in the vertical direction. The source 28 and the drain 29 are located at two different sides out of the gate 27 respectively, wherein the source 28 is located in the body region 26, and the drain 29 is located in the well 22 which is away from the body region 26. In the channel direction (as indicated by the direction of the dashed-line arrow in the figures), a part of the well 22 which is near the top surface 21a, and between the body region 26 and the drain 29, defines the drift region 22a. The drift region 22a separates the drain 29 from the body region 26. The drift region 22a serves as a drift current channel in the ON operation of the high voltage device 200.

The body contact 23 and the source 28 overlap with each other to define an overlap region 25, and the body contact 23 and the source 28' (of another high voltage device) overlap with each other to define an overlap region 25', wherein the overlap regions 25 and 25' have the first conductivity type.

The body contact 23 has a depth from the upper surface 21a of the semiconductor layer 21', wherein the depth is deeper than a depth of the source 28, and therefore, a part of the body contact 23 is located vertically below the overlap regions 25 and 25'.

The depth of the body contact 23 from the upper surface 21a of the semiconductor layer 21' is not deeper than a depth of the body region 28, and therefore, the body contact 23 is located in the body region 26 and is surrounded by the body region 26.

Each of the overlap regions 25 and 25' has a length in the channel direction, and this length is not shorter than a predetermined length, so as to suppress a parasitic bipolar junction transistor (BJT) from being turned on when the high voltage device 200 operates.

The parasitic bipolar junction transistor is formed by a part of the well 22, a part of the body region 26 and a part of the source 28, as indicated by a dashed-line NPNBJT electronic symbol in FIG. 2B.

The gate 27 and the overlap regions 25 and 25' extend in a width direction and are in parallel to one another.

Note that the term "inversion current channel" means thus. Taking this embodiment as an example, when the high voltage device 200 operates in the ON operation due to the voltage applied to the gate 27, an inversion layer is formed beneath the gate 27, so that the conduction current flows through the region of the inversion layer, which is the inversion current channel known to a person having ordinary skill in the art.

Note that the term "drift current channel" means thus. Taking this embodiment as an example, the drift region provides a region where the conduction current passes through in a drifting manner when the semiconductor device 200 operates in the ON operation, and the current path through the drift region is referred to as the "drift current channel", which is known to a person having ordinary skill in the art, so the details thereof are not redundantly explained here.

Note that the top surface 21a as defined in the context of this invention does not mean a completely flat plane but refers to a surface of the semiconductor layer 21'. In the present embodiment, for example, where the top surface 21a is in contact with the drift oxide region 24 is recessed.

Note that the gate 27 as defined in the context of this invention includes: a dielectric layer 271 in contact with the top surface 21a, a conductive layer 272 which is conductive, and a spacer layer 273 which is electrically insulative. The dielectric layer 271 is formed on the body region 26 and the well 22, and is in contact with the body region 26 and the well 22. The conductive layer 272 serves as an electrical contact of the gate 27, and is formed on the dielectric layer 271 and in contact with the dielectric layer 271. The spacer layer 273 is formed out of two sides of the conductive layer 272, as an electrically insulative layer of the gate 27. The gate 27 is known to a person having ordinary skill in the art, and the detailed description thereof is thus omitted.

Note that the above-mentioned "first conductivity type" and "second conductivity type" indicate different conductivity types of impurities which are doped in regions or layers of the high voltage device (such as but not limited to the aforementioned well, body region and source and the drain, etc.), so that the doped region or layer has the first or second conductivity type; the first conductivity type for example is N-type, and the second conductivity type is P-type, or the opposite. The first conductivity type and the second conductivity type are conductivity types which are opposite to each other.

In addition, note that the term "high voltage" device means that, when the device operates in normal operation, the voltage applied to the drain is higher than a voltage level, such as 5V or higher; for devices of different high voltages, a lateral distance (distance of the drift region 22a) between the body region 26 and the drain 29 can be determined according to the operation voltage that the device is designed to withstand during normal operation, which is known to a person having ordinary skill in the art.

One of the features of the present invention which is advantageous over the prior art is that, according to the present invention, taking this embodiment shown in FIGS. 2A-2C as an example, when the high voltage device 200 operates, the hot carriers generated by a high electric field (for example but not limited to holes in an N-type high voltage device) will be injected into the body contact 23 through a "hot carrier absorption channel" provided by the body region 26 (that is, the hot carriers are absorbed by the body contact 23 through the hot carrier absorption channel). Compared with the prior art, the resistance of the "hot carrier absorption channel" of the present invention is relatively low. This is because the body contact 23 of the present invention is closer to a PN junction formed by the body region 26 and the well 22, and the concentration of the second conductivity type impurities of the body contact 23 is higher than the concentration of the second conductivity type impurities of the body region 26. Therefore, when the aforementioned hot carriers flow through the aforementioned "hot carrier absorption channel", the voltage drop formed by the hot carrier current in the body region 26 is much lower than the prior art, so that the base voltage of the parasitic bipolar junction transistor formed by the body region 26, the source 28 and the well 22 is relatively low, which is insufficient to turn on the parasitic bipolar junction transistor, and thus the parasitic bipolar junction transistor will not be turned on when the high voltage device 200 operates. In this embodiment, the predetermined length of the overlap regions 25 and 25' in the channel direction is the longer the better for the effect of suppressing the parasitic bipolar junction transistor from being turned on. The safe operating area (SOA) of the high-voltage device 200 of the present invention thus increases and broadens the application range of the device.

Figure 3A:
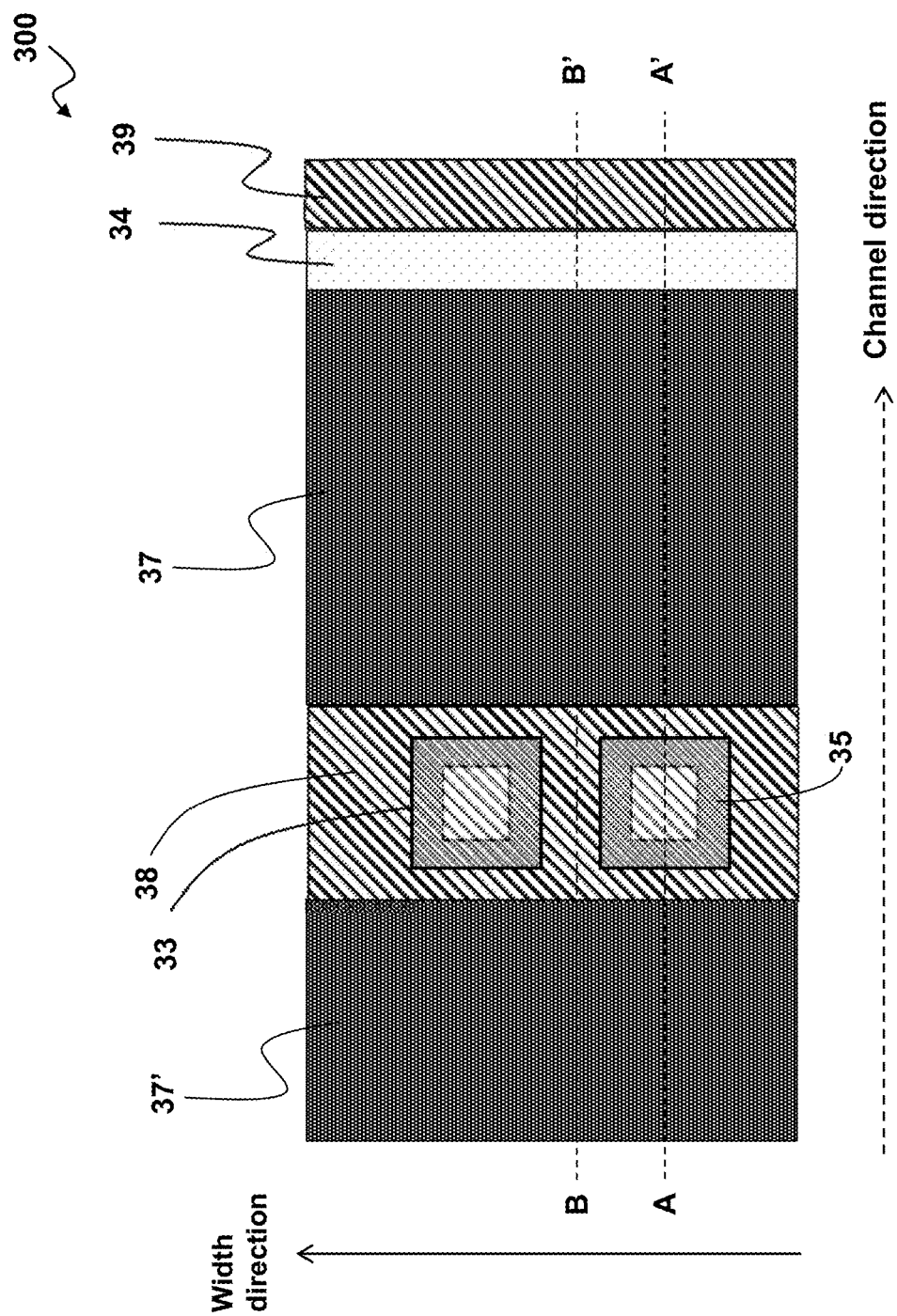
FIGS. 3A-3C show a second embodiment of the present invention.
Figure 3B:
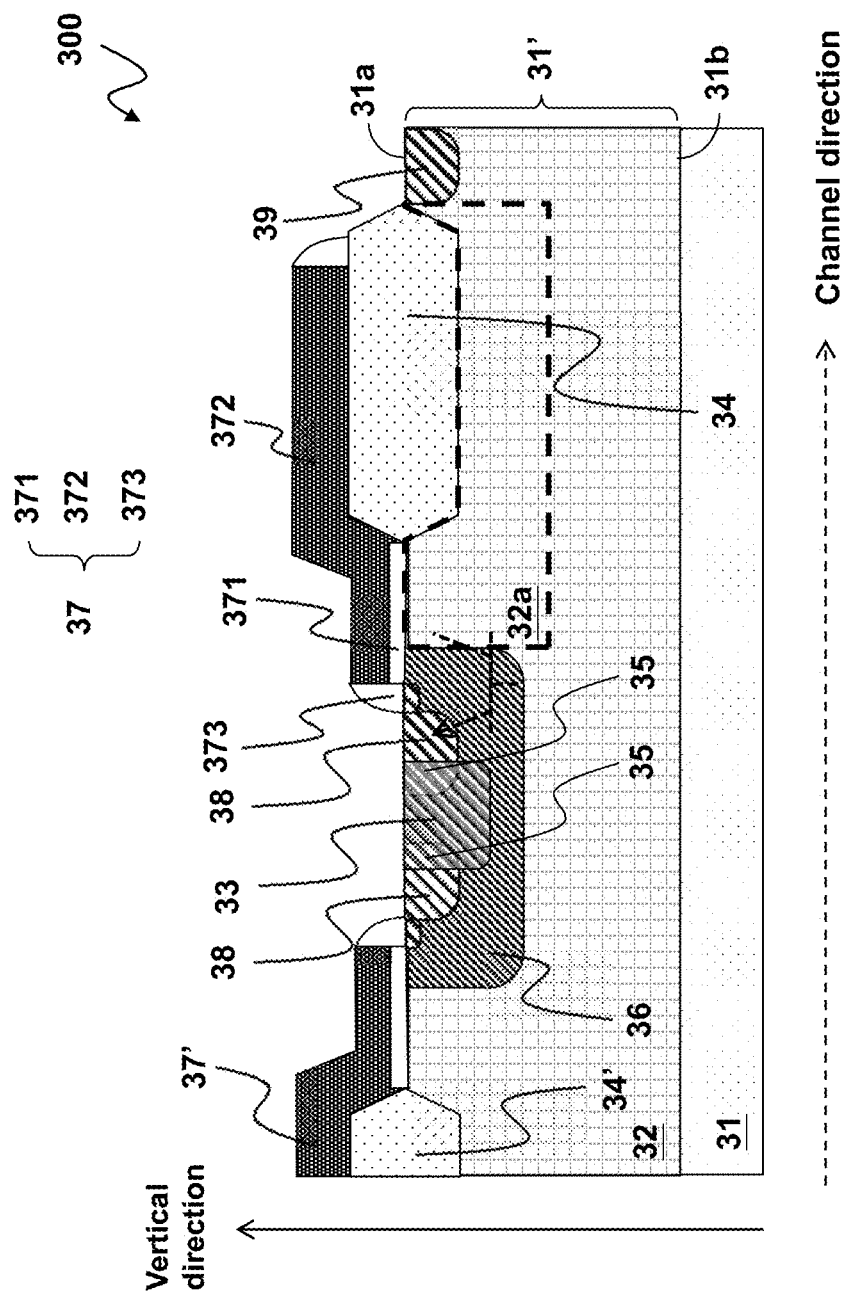
Figure 3C:
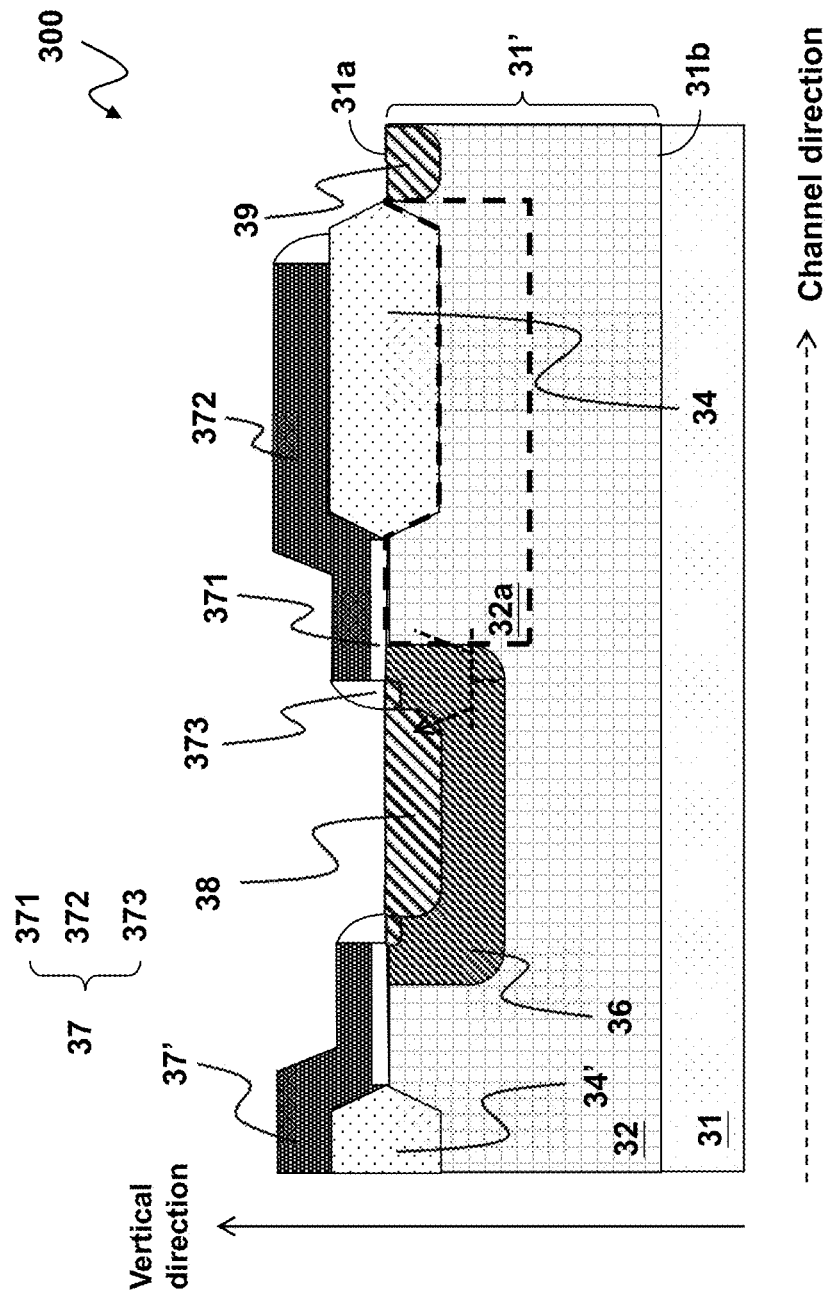

Please refer to FIGS. 3A-3C, which show a second embodiment of the present invention. FIGS. 3A, 3B, and 3C show a top view diagram, a cross-sectional diagram along a cross-section line AA', and a cross-sectional diagram along a cross-section line BB' of a high voltage device 300 in accordance with one embodiment of the present invention. The high voltage device 300 includes a semiconductor layer 31', a well 32, a body contact 33, a drift oxide region 34, a body region 36, a gate 37, a source 38 and a drain 39. When the high voltage device 300 is formed, plural device units are formed concurrently in a mirror arrangement, wherein two adjacent device units share the same body region 36, source 38 and body contact 33. Therefore, as shown in FIGS. 3A-3C, the drift oxide region 34' (of another high voltage device) is mirror-symmetric to the drift oxide region 34; the gate 37' (of another high voltage device) is mirror-symmetric to the gate 37, and so on.

The semiconductor layer 31' is formed on the substrate 31. The semiconductor layer 31' has a top surface 31a and a bottom surface 31b opposite to the top surface 31a in a vertical direction (as indicated by the direction of the solid arrow in FIGS. 3B and 3C). The substrate 31 is, for example but not limited to, a P-type or N-type semiconductor substrate. The semiconductor layer 31', for example, is formed on the substrate 31 by an epitaxial process step, or is a part of the substrate 31. The semiconductor layer 31' can be formed by various methods known to a person having ordinary skill in the art, so the details thereof are not redundantly explained here.

Still referring to FIGS. 3A-3C, the drift oxide region 34 is formed on and in contact with the top survice 31a and is located above the drift region 32a (as indicated by the dashed-line frames in FIGS. 3B and 3C). In one embodiment, the drift oxide region 34 is, for example but not limited to, the local oxidation of silicon (LOCOS) structure shown in FIGS. 3B and 3C; in another embodiment, it can be a shallow trench isolation (STI) structure or a chemical vapor deposition (CVD) oxide region. Manufacturing methods of the LOCOS structure, the STI structure, and the CVD oxide region are well known by those skilled in the art, so details thereof are omitted here.

The well 32 has the first conductivity type, and is formed in the semiconductor layer 31'. The well 32 is located beneath and in contact with the top surface 31a in the vertical direction. The body region 36 has a second conductivity type, and is formed in the well 32. The body region 36 is located beneath and in contact with the top surface 31a in the vertical direction. The body contact 33 is formed in the body region 36, and has the second conductivity type. The body contact 33 is configured as an electrical contact of the body region 36. The body contact 33 is located beneath and in contact with the top surface 31a in the vertical direction. The gate 37 is formed on the top surface 31a of the semiconductor layer 31'. The gate 37 is substantially a rectangular shape which extends along a width direction (as indicated by the direction of the solid arrow in FIG. 3A) when viewed from the top view. A part of the body region 36 is located vertically below the gate 37 and is in contact with the gate 37 in the vertical direction, so as to provide an inversion current channel in the ON operation of the high voltage device 300. The concentration of the second conductivity type impurities of the body contact 33 is higher than the concentration of the second conductivity type impurities of the body region 36.

Still referring to FIGS. 3A-3C, the source 38 and the drain 39 have the first conductivity type. The source 38 and the drain 39 are formed beneath the top surface 31a and in contact with the top surface 31a in the vertical direction. The source 38 and the drain 39 are located at two different sides out of the gate 37 respectively, wherein the source 38 is located in the body region 36, and the drain 39 is located in the well 32 which is away from the body region 36. In the channel direction (as indicated by the direction of the dashed-line arrow in the figures), a part of the well 32 which is near the top surface 31a, and between the body region 36 and the drain 39, defines the drift region 32a. The drift region 32a separates the drain 39 from the body region 36. The drift region 32a serves as a drift current channel in the ON operation of the high voltage device 300.

The body contact 33 and the source 38 overlap with each other to define an overlap region 35, wherein the overlap region 35 has the first conductivity type.

The body contact 33 has a depth from the upper surface 31a of the semiconductor layer 31', wherein the depth is deeper than a depth of the source 38, and therefore, a part of the body contact 33 is located vertically below the overlap region 35.

The depth of the body contact 33 from the upper surface 31a of the semiconductor layer 31' is not deeper than a depth of the body region 38, and therefore, the body contact 33 is located in the body region 36 and is surrounded by the body region 36.

The overlap region 35 has a length in the channel direction, and this length is not shorter than a predetermined length, so as to suppress a parasitic bipolar junction transistor (BJT) from being turned on when the high voltage device 300 operates.

The parasitic bipolar junction transistor is formed by a part of the well 32, a part of the body region 36 and a part of the source 38, as indicated by a dashed-line NPNBJT electronic symbol in FIG. 3B.

This embodiment is different from the first embodiment in that, in the first embodiment, the gate 27 and the plural sources 28 and 28' extend in parallel in the width direction, whereas, in this embodiment, the source 38 is a single continuous region which is shared by two adjacent device units, but the body contact 33 includes plural sub-regions (FIG. 3A), wherein the plural sub-regions are separated from each other by the source 38, and each sub-region is surrounded by the source 38.

Note that the gate 37 as defined in the context of this invention includes: a dielectric layer 371 in contact with the top surface 31a, a conductive layer 372 which is conductive, and a spacer layer 372 which is electrically insulative. The dielectric layer 371 is formed on the body region 36 and the well 32, and is in contact with the body region 36 and the well 32. The conductive layer 372 serves as an electrical contact of the gate 37, and is formed on the dielectric layer 371 and in contact with the dielectric layer 371. The spacer layer 373 is formed out of two sides of the conductive layer 372, as an electrically insulative layer of the gate 37. The gate 37 is known to a person having ordinary skill in the art, so the detailed description thereof is omitted here.

Figure 4A:
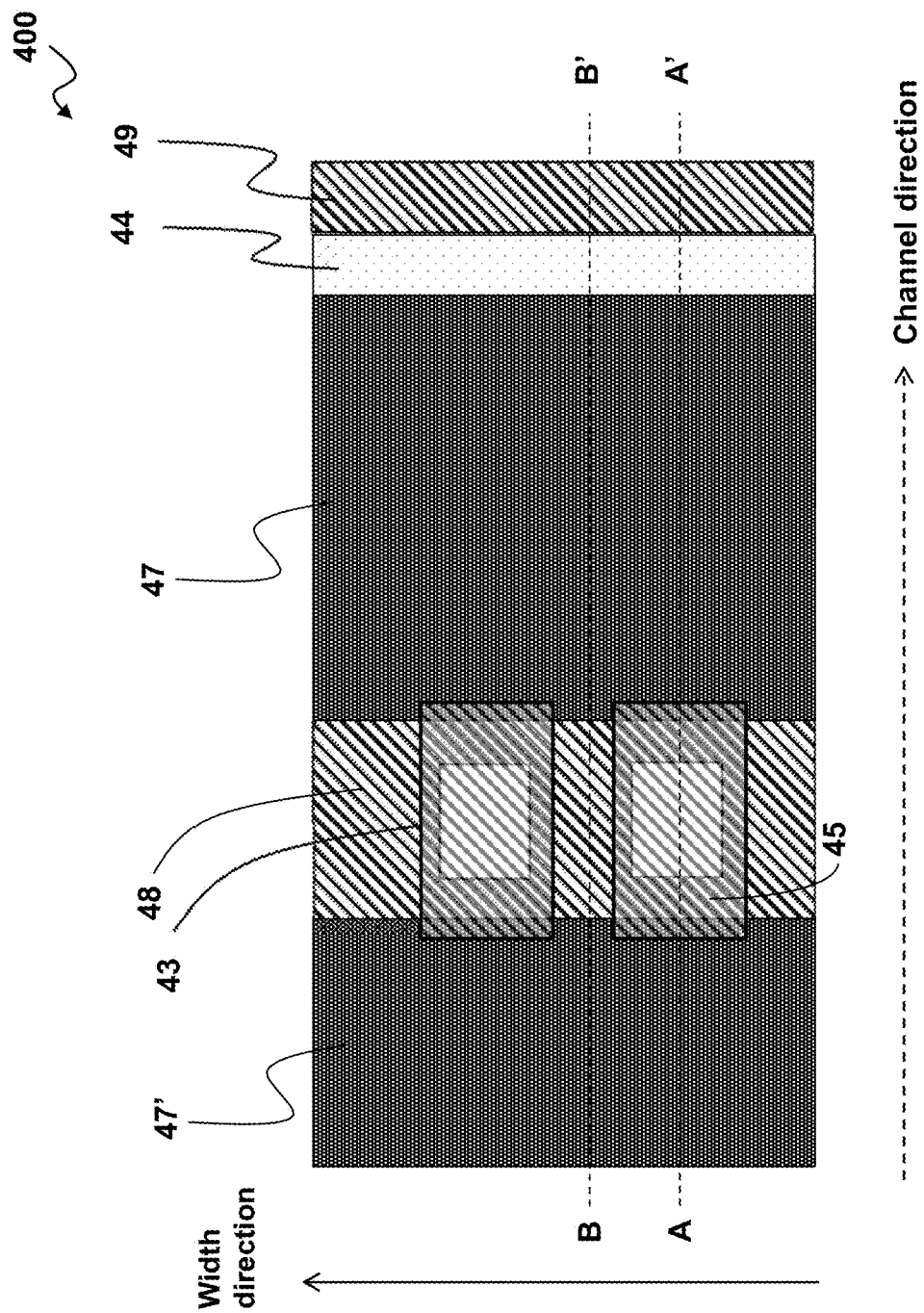
FIGS. 4A-4C show a third embodiment of the present invention.
Figure 4B:
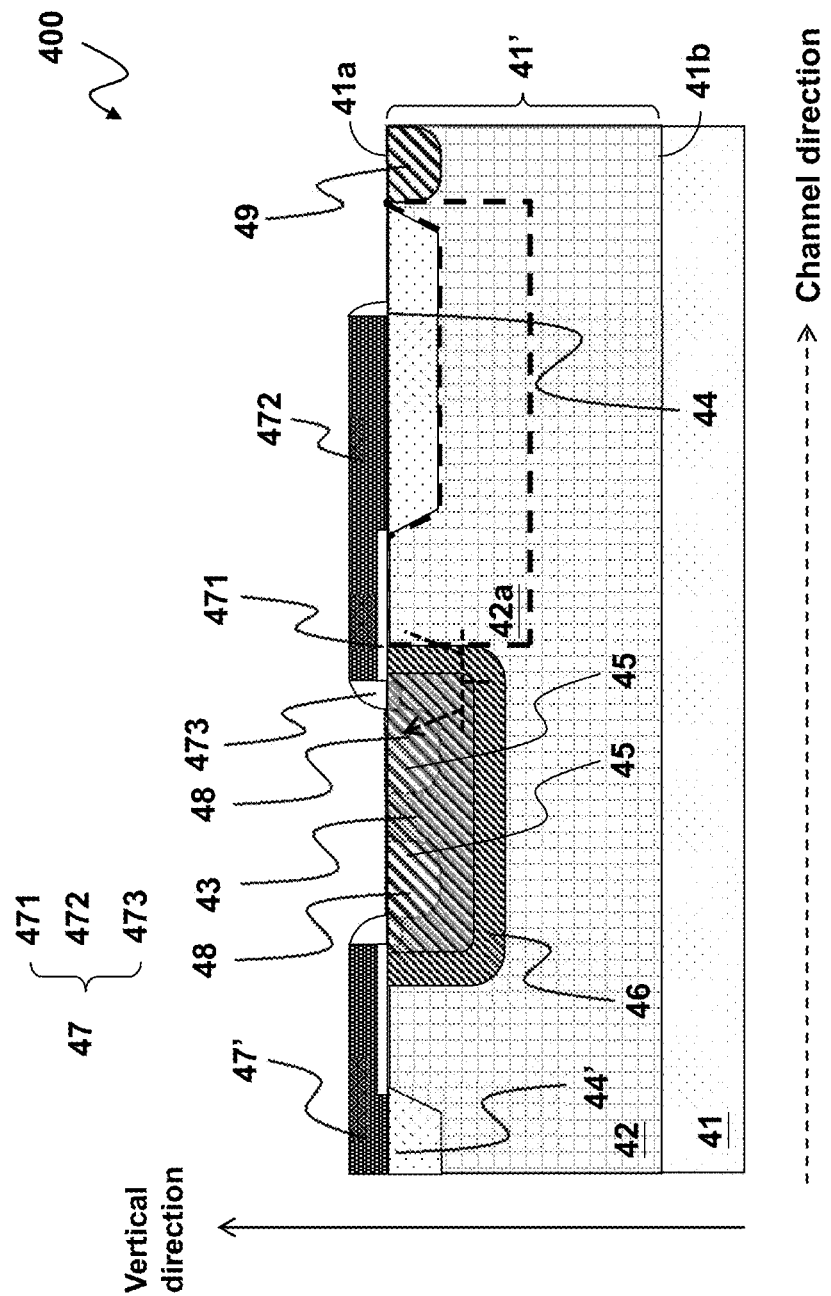
Figure 4C:
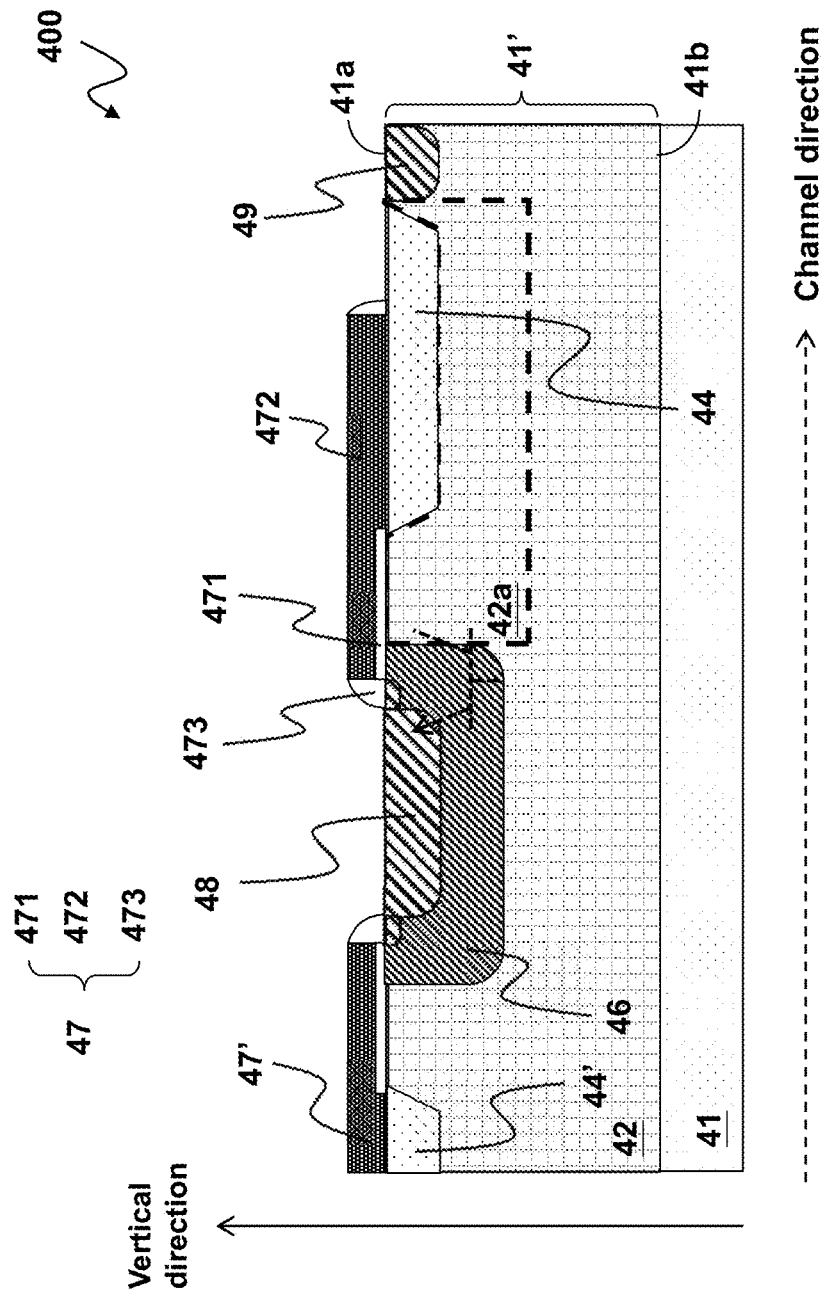

Please refer to FIGS. 4A-4C, which show a third embodiment of the present invention. FIGS. 4A, 4B, and 4C show a top view diagram, a cross-sectional diagram along a cross-section line AA', and a cross-sectional diagram along a cross-section line BB' of a high voltage device 400 in accordance with one embodiment of the present invention. The high voltage device 400 includes a semiconductor layer 41', a well 42, a body contact 43, a drift oxide region 44, a body region 46, a gate 47, a source 48 and a drain 49. When the high voltage device 400 is formed, plural device units are formed concurrently in a mirror arrangement, wherein two adjacent units share the same body region 46, source 48 and body contact 43. Therefore, as shown in FIGS. 4A-4C, the drift oxide region 44' (of another high voltage device) is mirror-symmetric to the drift oxide region 44; the gate 47' (of another high voltage device) is mirror-symmetric to the gate 47, and so on.

The semiconductor layer 41' is formed on the substrate 41. The semiconductor layer 41' has a top surface 41a and a bottom surface 41b opposite to the top surface 41a in a vertical direction (as indicated by the direction of the solid arrow in FIGS. 4B and 4C). The substrate 41 is, for example but not limited to, a P-type or N-type semiconductor substrate. The semiconductor layer 41', for example, is formed on the substrate 41 by an epitaxial process step, or is a part of the substrate 41. The semiconductor layer 41' can be formed by various methods known to a person having ordinary skill in the art, so the details thereof are not redundantly explained here.

Still referring to FIGS. 4A-4C, The drift oxide region 44 is formed on and in contact with the top survice 41a and is located above the drift region 42a (as indicated by the dashed-line frames in FIGS. 4B and 4C). In one embodiment, the drift oxide region 44 is, for example but not limited to, the shallow trench isolation (STI) structure shown in FIGS. 4B and 4C; in another embodiment, it can be a local oxidation of silicon (LOCOS) structure or a chemical vapor deposition (CVD) oxide region. Manufacturing methods of the LOCOS structure, the STI structure, and the CVD oxide region are well known by those skilled in the art, so details thereof are omitted here.

The well 42 has a first conductivity type, and is formed in the semiconductor layer 41'. The well 42 is located beneath and in contact with the top surface 41a in the vertical direction. The body region 46 has a second conductivity type, and is formed in the well 42. The body region 46 is located beneath and in contact with the top surface 41a in the vertical direction. The body contact 43 is formed in the body region 46, and has the second conductivity type. The body contact 43 is configured as an electrical contact of the body region 46. The body contact 43 is located beneath and in contact with the top surface 41a in the vertical direction. The gate 47 is formed on the top surface 41a of the semiconductor layer 41'. The gate 47 is substantially a rectangular shape which extends along a width direction (as indicated by the direction of the solid arrow in FIG. 4A) when viewed from the top view. A part of the body region 46 is located vertically below the gate 47 and is in contact with the gate 47 in the vertical direction, so as to provide an inversion current channel in the ON operation of the high voltage device 400. The concentration of the second conductivity type impurities of the body contact 43 is higher than the concentration of the second conductivity type impurities of the body region 46.

Still referring to FIGS. 4A-4C, the source 48 and the drain 49 have the first conductivity type. The source 48 and the drain 49 are formed beneath the top surface 41a and in contact with the top surface 41a in the vertical direction. The source 48 and the drain 49 are located at two different sides out of the gate 47 respectively, wherein the source 48 is located in the body region 46, and the drain 49 is located in the well 42 which is away from the body region 46. In the channel direction (as indicated by the direction of the dashed-line arrow in the figures), a part of the well 42 which is near the top surface 41a, and between the body region 46 and the drain 49, defines the drift region 42a. The drift region 42a separates the drain 49 from the body region 46.

The drift region 42a serves as a drift current channel in the ON operation of the high voltage device 400.

The body contact 43 and the source 48 overlap with each other to define an overlap region 45, wherein the overlap region 45 has the first conductivity type.

The body contact 43 has a depth from the upper surface 41a of the semiconductor layer 41', wherein the depth is deeper than a depth of the source 48, and therefore, a part of the body contact 43 is located vertically below the overlap region 45.

The depth of the body contact 43 from the upper surface 41a of the semiconductor layer 41' is not deeper than a depth of the body region 48, and therefore, the body contact 43 is located in the body region 46 and is surrounded by the body region 46.

The overlap region 45 has a length in the channel direction, and this length is not shorter than a predetermined length, so as to suppress a parasitic bipolar junction transistor (BJT) from being turned on when the high voltage device 400 operates.

The parasitic bipolar junction transistor is formed by a part of the well 42, a part of the body region 46 and a part of the source 48 as indicated by a dashed-line NPNBJT electronic symbol in FIGS. 4B and 4C.

In the second embodiment of FIGS. 3A-3C, the source 38 is a single continuous region which is shared by two adjacent device units, and the body contact 33 includes plural sub-regions (FIG. 3A), wherein the plural sub-regions are separated from each other by the source 38, and each sub-region is surrounded by the source 38. In this embodiment of FIGS. 4A-4C, the source 48 is a single continuous region which is shared by two adjacent device units, and the body contact 44 includes plural sub-regions (FIG. 4A), wherein the plural sub-regions are separated from each other by the source 48, and each sub-region is surrounded by the source 48. However, this embodiment of FIGS. 4A-4C is different from the second embodiment in that, a part of the overlap region 45 is located right below the spacer layer 473 of the gate 47. Besides, in the second embodiment, the drift oxide region 34 is the LOCOS structure, while in this embodiment, the drift oxide region 44 is the STI structure.

Figure 5A:
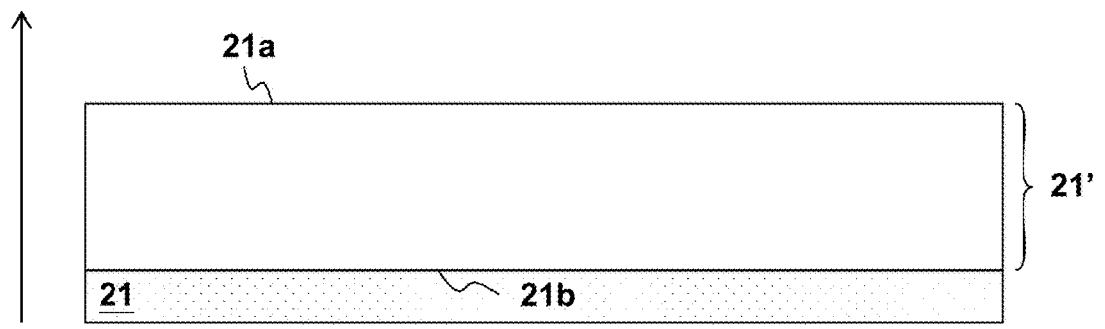
FIGS. 5A-5I show a fourth embodiment of the present invention.

Please refer to FIGS. 5A-5I, which illustrate diagrams showing a method for manufacturing a high voltage device 200 in accordance with one embodiment of the present invention. As shown in FIG. 5A, first, a semiconductor layer 21' is formed on a substrate 21. The semiconductor layer 21', for example, is formed on the substrate 21 by an epitaxial process step, or is a part of the substrate 21. The semiconductor layer 21' has a top surface 21a and a bottom surface 21b opposite to the top surface 21a in a vertical direction (as indicated by the direction of the dashed-line arrow in FIG. 5A). The semiconductor layer 21' can be formed by various methods known to a person having ordinary skill in the art, so the details thereof are not redundantly explained here. The substrate 21 is, for example but not limited to, a P-type or N-type semiconductor substrate.

Figure 5B:
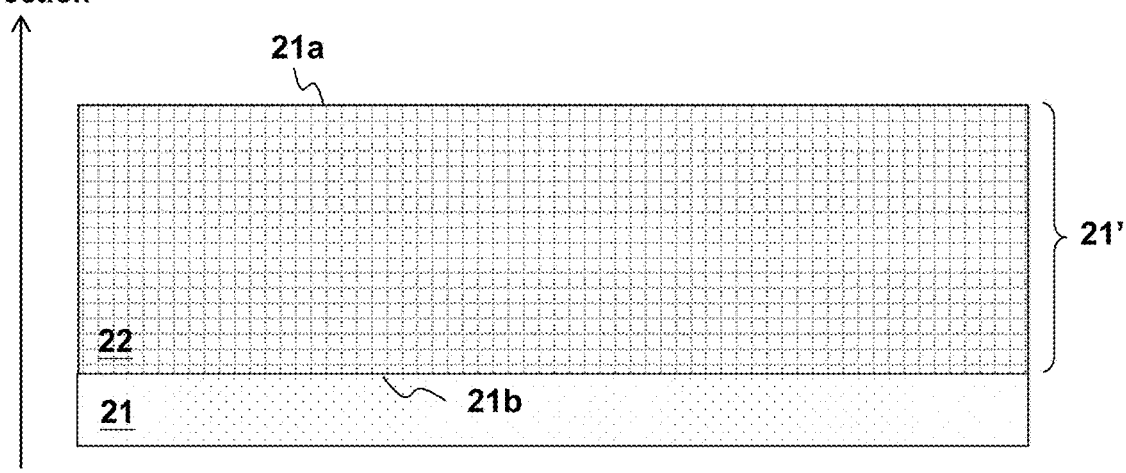

Subsequently, referring to FIG. 5B, a well 22 is formed in the semiconductor layer 21', wherein the well 32 is located beneath and in contact with the top surface 21a in the vertical direction. The well 22 has a first conductivity type, and for example may be formed by doping impurities of the first conductivity type into the semiconductor layer 21' in the form of accelerated ions by, for example but not limited to, one or more ion implantation process steps which are indicated by dashed-line arrows in FIG. 5B.

Figure 5C:
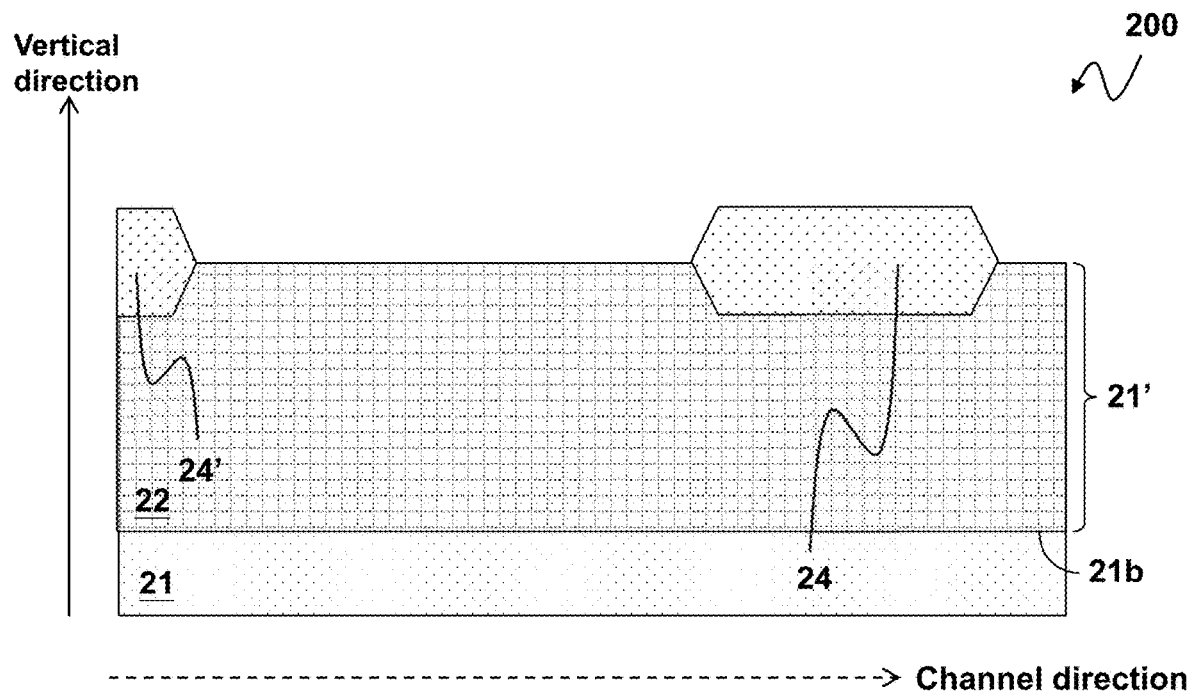

Next, referring to FIG. 5C, a drift oxide region 24 is formed on and in contact with the top survice 21a. In one embodiment, the drift oxide region 24 is, for example but not limited to, the local oxidation of silicon (LOCOS) structure shown in the figure; in another embodiment, it can be a shallow trench isolation (STI) structure or a chemical vapor deposition (CVD) oxide region. The drift oxide region 24 is located above the drift region 22a (referring to FIGS. 5D and 2B)

Figure 5D:
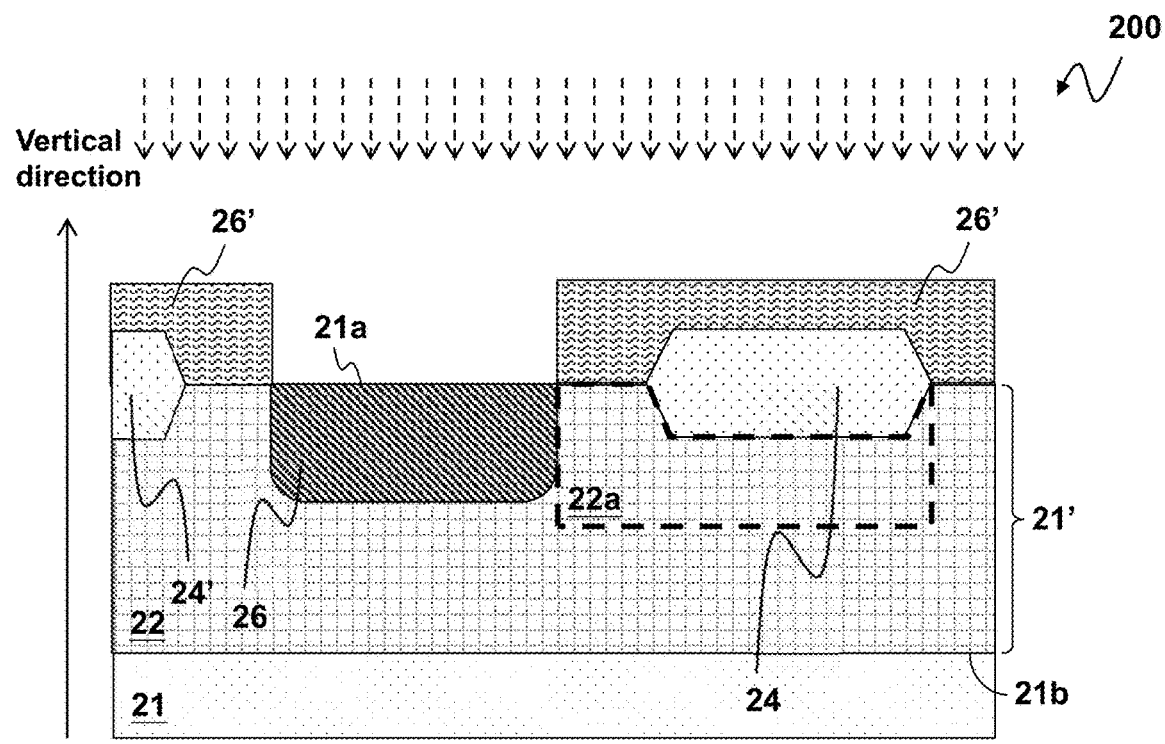

Next, referring to FIG. 5D, a body region 26 is formed in the well 22, and is located beneath and in contact with the top surface 21a in the vertical direction. The body region 26 has the second conductivity type. The body region 26 may be formed by: forming a photoresist layer 26' as a mask by a lithography process step and implanting impurities of the second conductivity type into the well region 22 in the form of accelerated ions in an ion implantation step, as indicated by the vertical dashed-line arrow in FIG. 5D. The concentration of the second conductivity type impurities of the body region 26 is higher than the concentration of the second conductivity type impurities of the well 22.

Figure 5E:
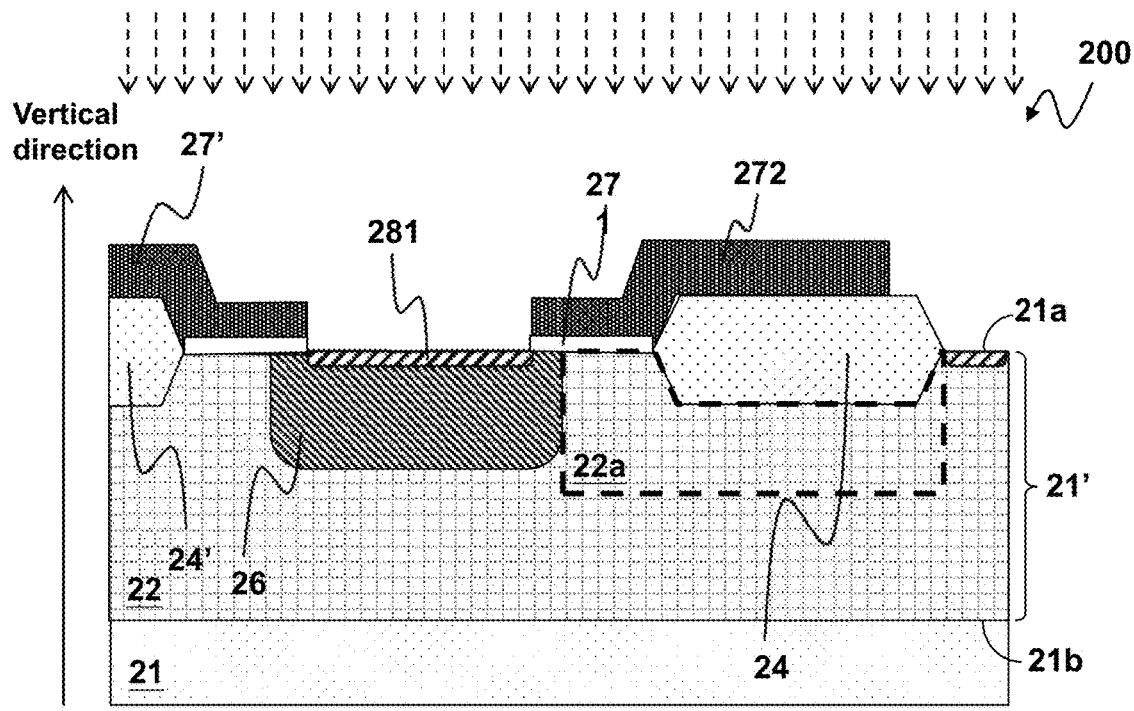

Please refer to FIG. 5E. Subsequently, a dielectric layer 271 and a conductive layer 272 of the gate 27 are formed on the top surface 21a of the semiconductor layer 21'. The gate 27 is substantially a rectangular shape which extends along a width direction (as indicated by the direction of the solid arrow in FIG. 2A) when viewed from the top view. A part of the body region 26 is located vertically beneath and in contact with the gate 27 in a vertical direction (as indicated by the direction of the dashed-line arrow in FIG. 5E), so as to provide an inversion current channel during the ON operation of the high voltage device 200.

Still referring to FIG. 5E, in one embodiment, after the dielectric layer 271 and the conductive layer 272 of the gate 27 are formed, a lightly doped region 281 is formed, so as to provide a conduction channel below a spacer layer 273 during the ON operation of the high voltage device 200; this is because the body region 26 beneath the spacer layer 273 cannot form the inversion current channel during the ON operation of the high voltage device 200. The lightly doped region 281 for example can be formed by implanting impurities of the first conductivity type into the body region 26 in the form of accelerated ions in an ion implantation step as indicated by the vertical dashed-line arrow in FIG. 5E. The portion of the lightly doped region 281 in the overlapped region between the lightly doped region 281 and the source 28 can be omitted because the concentration of the impurities of the first conductivity type in the lightly doped region 281 is far lower than that of the impurities of the first conductivity type in the source 28; for this reason, this portion of the lightly doped region 281 is also omitted in the following figures.

Figure 5F:
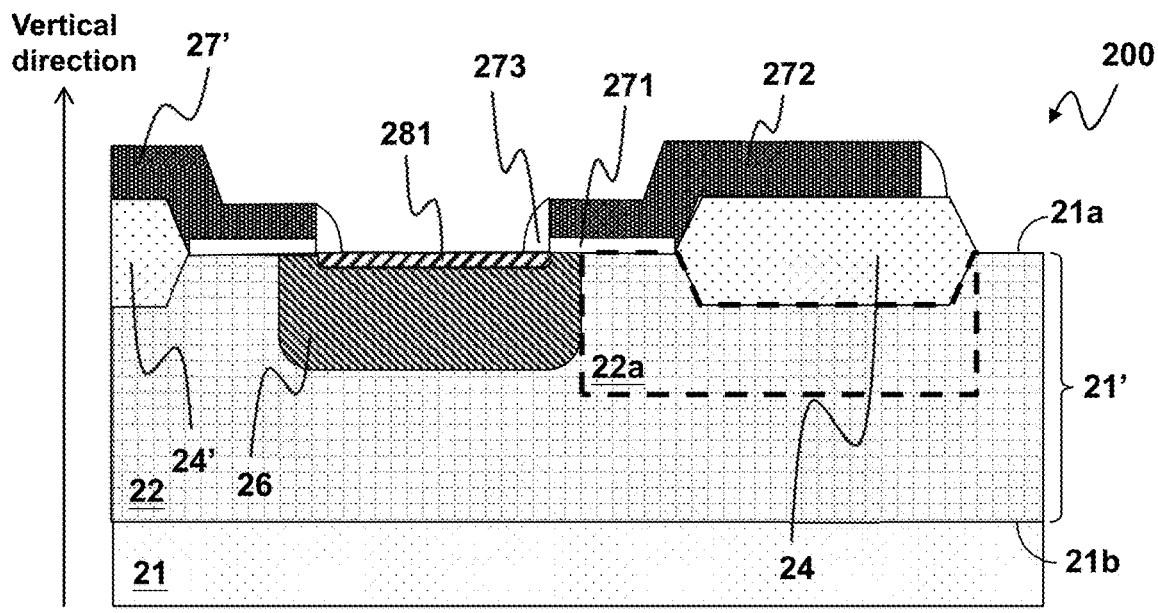

Next, as shown in FIG. 5F, spacer layers 273 are formed on the lateral surfaces of the conductive layer 272, to complete the gate 27.

Figure 5G:
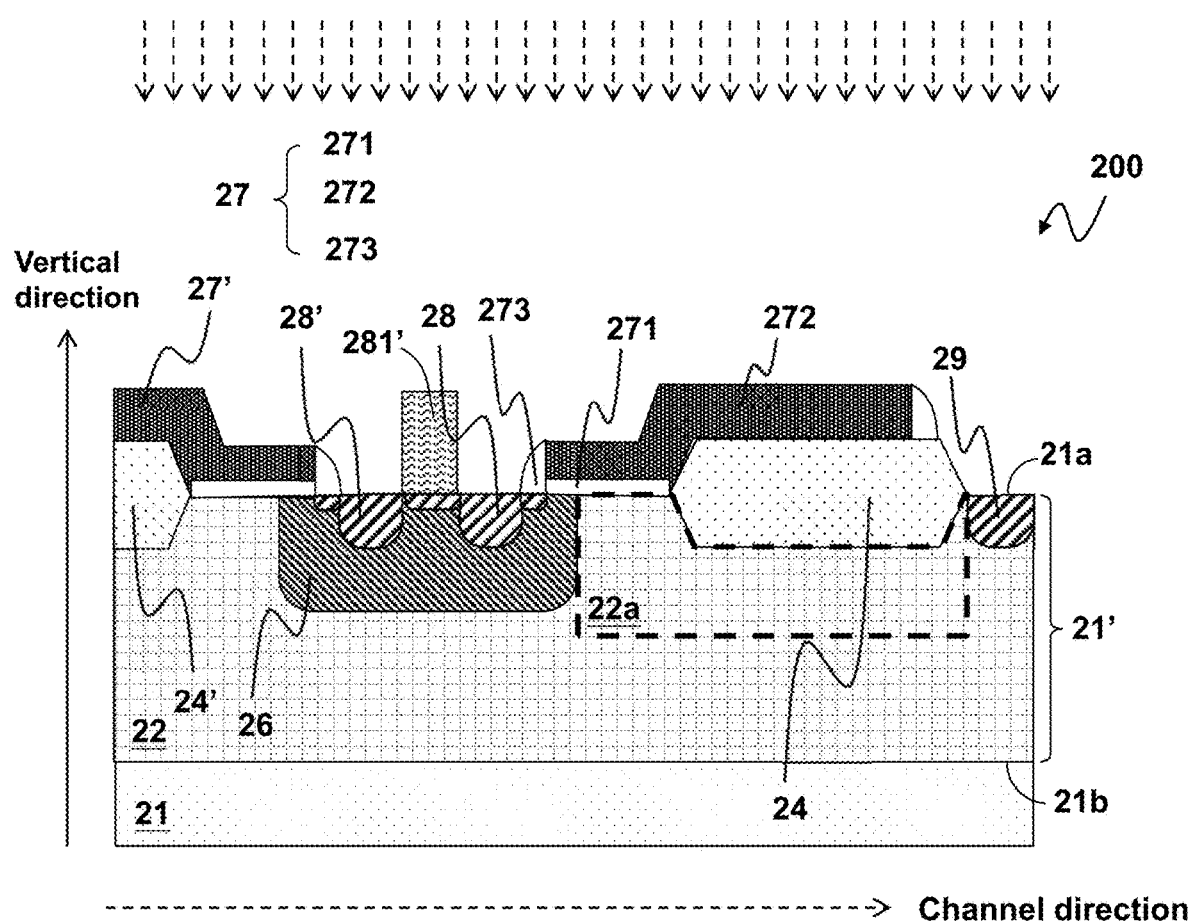

Subsequently, referring to FIG. 5G, a source 28 and a drain 29 are formed beneath the top surface 21a and in contact with the top surface 21a in the vertical direction. The source 28 and the drain 29 are located below the gate 27 respectively at two sides of the gate 27 in the channel direction; the source 28 is located in the body region 26, and the drain 29 is located in the well region 22 and away from the body region 26. The drift region 22a is located between the drain 29 and the body region 26 in the channel direction as indicated by the direction of the dashed-line arrows in FIG. 5G), in the well 22 near the top surface 21a, to serve as a drift current channel of the high voltage device 200 during ON operation. The source 28 and 28' and the drain 29 have the first conductivity type. The source 28 and 28' and the drain 29 may be formed by, for example but not limited to, forming a photoresist layer 281' as a mask by a lithography process step, and implanting impurities of the first conductivity type into the body region 26 and the well region 22 in the form of accelerated ions in an ion implantation process step as indicated by the vertical dashed-line arrows in FIG. 5G.

Figure 5H:
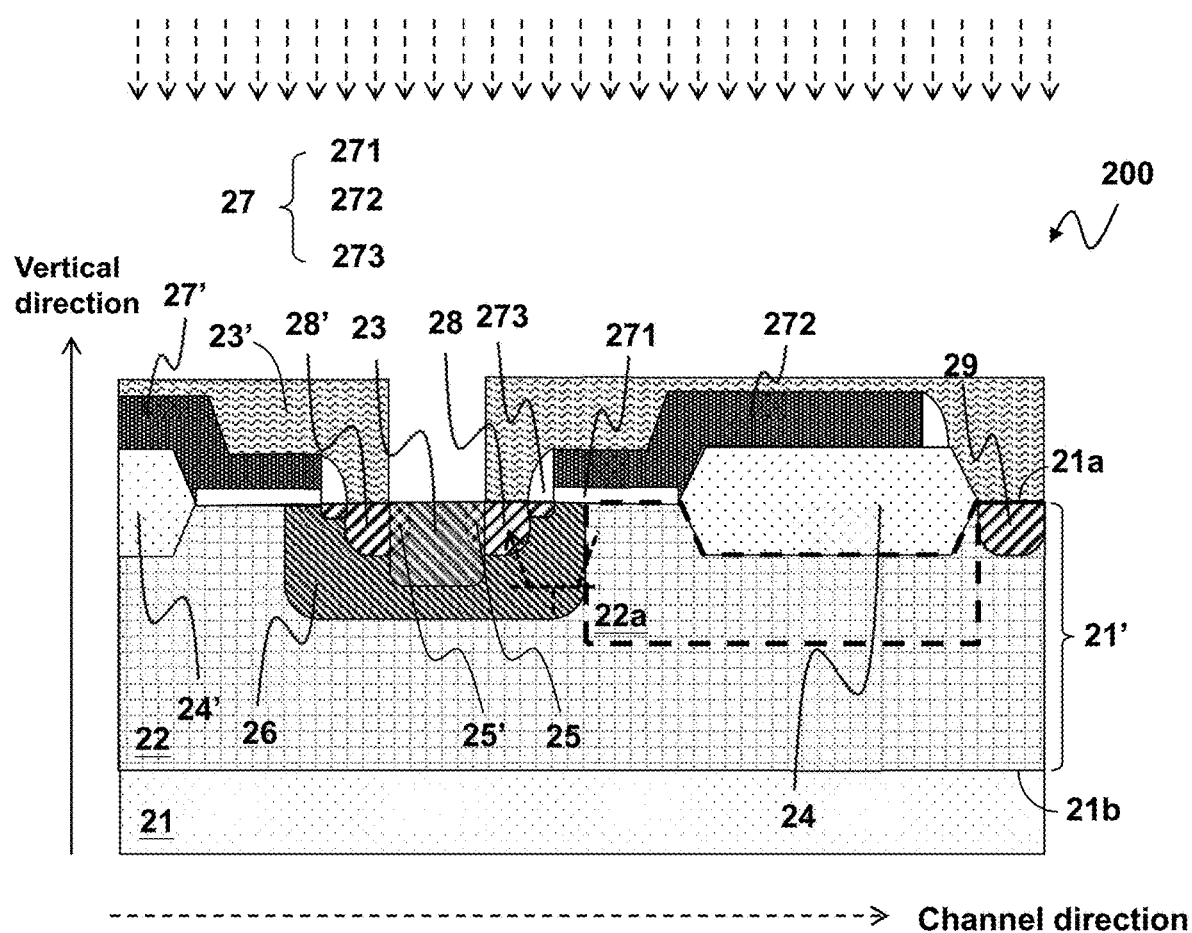

Next, as shown in FIG. 5H, a body contact 23 is formed in the body region 26. The body contact 23 has the second conductivity type, and is configured as an electrical contact of the body region 26. In the vertical direction, the body contact 23 is formed beneath and in contact with the top surface 21a in the body region 26. Please refer to the partial cross-sectional diagram FIG. 2C as well. The body contact 23 and the source 28 overlap to define overlap regions 25 and 25', wherein the overlap regions 25 and 25' have the first conductivity type. The body contact 23 has a depth from the upper surface 21a of the semiconductor layer 21', wherein the depth is deeper than a depth of the source 28, and therefore, a part of the body contact 23 is located vertically below the overlap regions 25 and 25'. The depth of the body contact 23 from the upper surface 21a of the semiconductor layer 21' is not deeper than a depth of the body region 28, and therefore, the body contact 23 is located in the body region 26 and is surrounded by the body region 26. Each of the overlap regions 25 and 25' has a length in the channel direction, and this length is not shorter than a predetermined length, so as to suppress a parasitic bipolar junction transistor (BJT) from being turned on when the high voltage device 200 operates. The body region 26 for example may be formed by: forming a photoresist layer 23' as a mask by a lithography process step and implanting impurities of the second conductivity type into the body region 26 in the form of accelerated ions in an ion implantation step, as indicated by the vertical dashed-line arrow in FIG. 5H. The concentration of the second conductivity type impurities of the body contact 23 is higher than the concentration of the second conductivity type impurities of the body region 26. The concentration of the second conductivity type impurities of the body contact 23 is lower than the concentration of the first conductivity type impurities of the source 28.

Figure 5I:
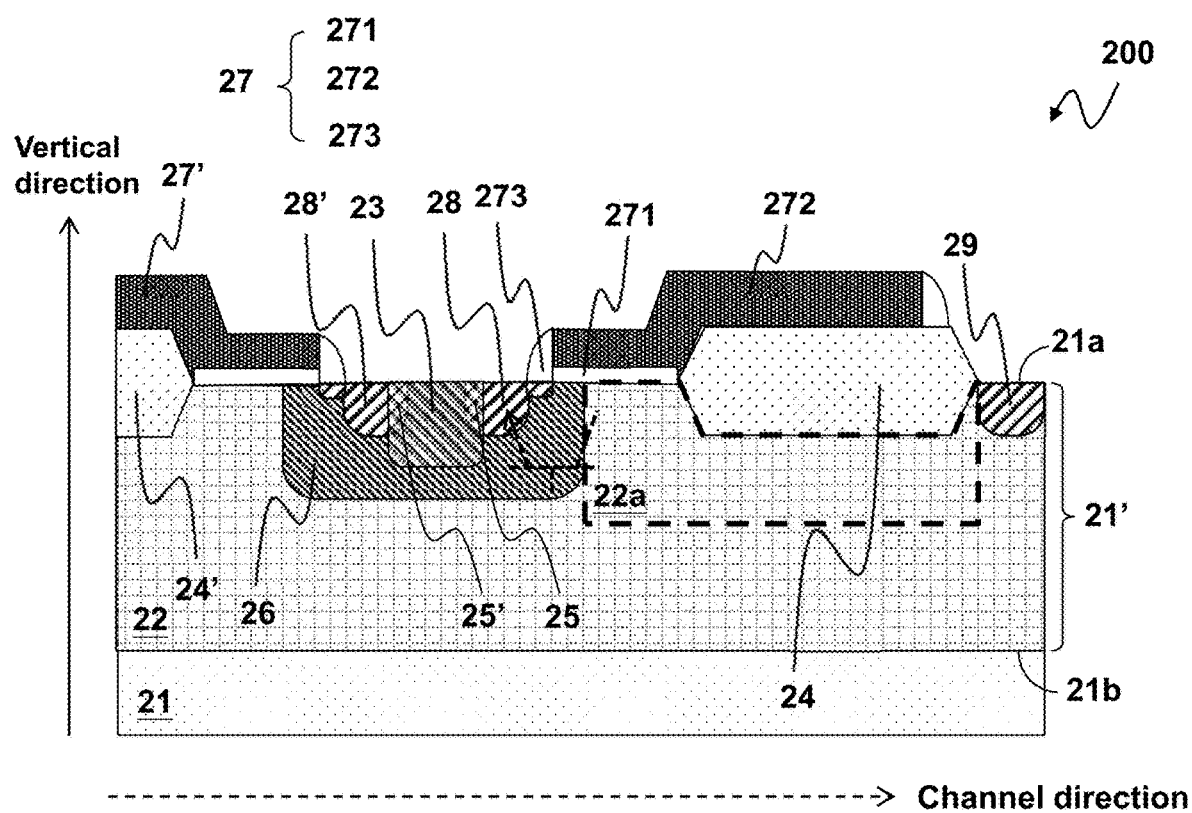

Next, as shown in FIG. 5I, the photoresist layer 23' is removed to form the high voltage device 200.

Figure 6A:
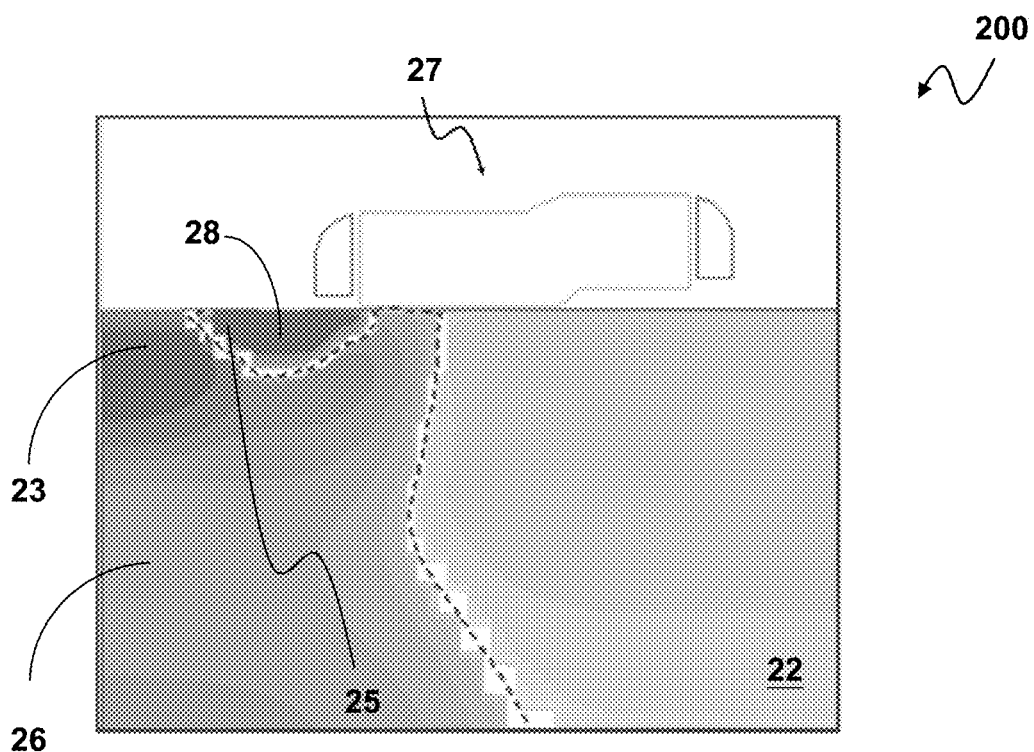
FIG. 6A shows a simulation diagram by technology computer aided design (TCAD) of a high voltage device according to the present invention.

FIG. 6A shows FIG. 6A shows a simulation diagram by technology computer aided design (TCAD) of the high voltage device 200 according to the present invention. As shown in FIG. 6A, the concentration of the second conductivity type impurities of the well 22 is the lowest, relative to the body region 26, the body contact 23 and the source 28; the concentration of the second conductivity type impurities of the body contact 23 is higher than that of the body region 26; the concentration of the second conductivity type impurities of the body contact 23 is lower than the concentration of the first conductivity type impurities of the source 28. Therefore, the overlap region 25 has the second conductivity type, and a part of the body contact 23 is located right below the overlap region 25.

Figure 6B:
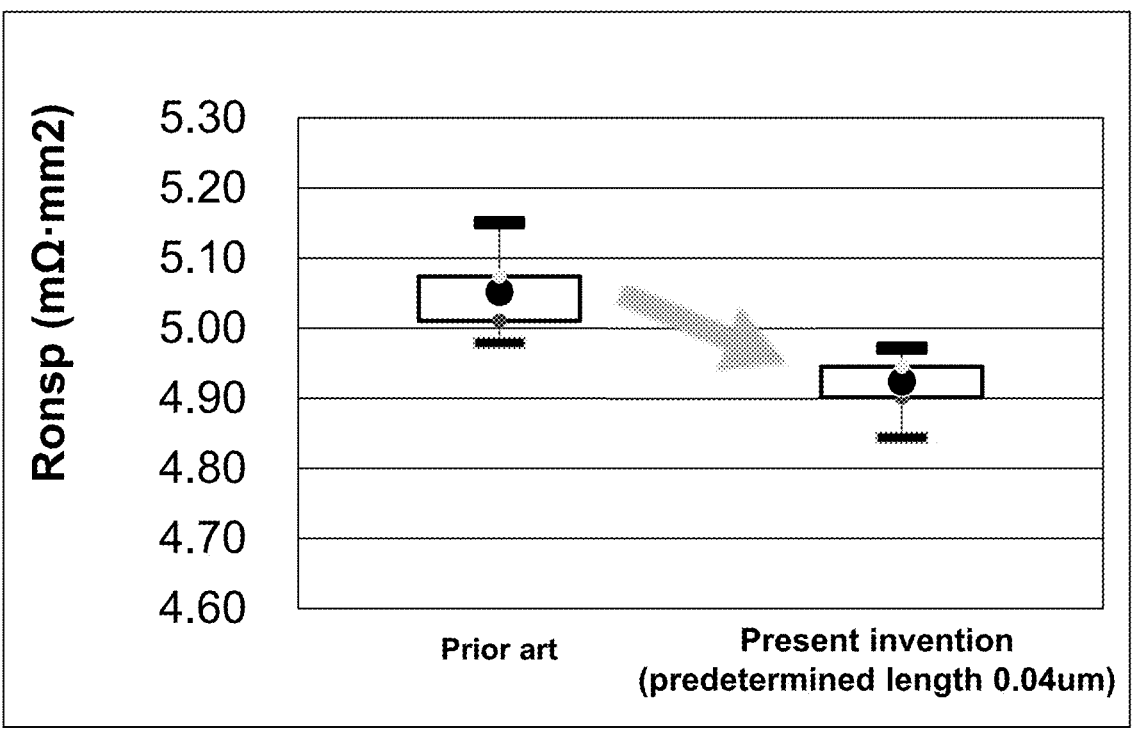
FIG. 6B shows a comparison of conduction resistances of high voltage devices of a prior art and the present invention.

FIG. 6B shows a comparison of conduction resistances of high voltage devices of a prior art and the present invention. As shown in FIG. 6B, according to the present invention, a length of the overlap region in the channel direction is 0.04 µm. Compared with the prior art, the conduction resistance of the high voltage device according to the present invention is significantly lower than that of the high voltage device of the prior art, and the voltage drop generated by the hot carrier current flowing through the body region of the high voltage device according to the present invention is lower, and thefore, the present invention is advantageous over the prior art in that the present invention can prevent the parasitic bipolar junction transistor from being turned on. Therefore, according to the present invention, the safe operation area is increased, and the scope of application is increased.

The present invention has been described in considerable detail with reference to certain preferred embodiments thereof. It should be understood that the description is for illustrative purpose, not for limiting the broadest scope of the present invention. Those skilled in this art can readily conceive variations and modifications within the spirit of the present invention. For example, other process steps or structures, such as a deep well, may be added. For another example, the lithography technique is not limited to the mask technology but it can be electron beam lithography, etc. The various embodiments described above are not limited to being used alone; two embodiments may be used in combination, or a part of one embodiment may be used in another embodiment. Therefore, in the same spirit of the present invention, those skilled in the art can think of various equivalent variations and modifications, which should fall in the scope of the claims and the equivalents.

What is claimed is:

1. A high voltage device, comprising:
   a semiconductor layer, which is formed on a substrate;
   a well, which has a first conductivity type, and is formed in the semiconductor layer;
   a body region, which has a second conductivity type, and is formed in the well;
   a body contact, which has the second conductivity type, and is configured to operably serve as an electrical contact of the body region, wherein the body contact is formed in the body region;
   a gate, which is formed on the semiconductor layer, wherein a part of the body region is located vertically beneath and in contact with the gate, so as to provide an inversion current channel during an ON operation of the high voltage device;
   a source, which has the first conductivity type, and is formed in the body region, wherein the source is located below the gate and out of one side of the gate; and
   a drain, which has the first conductivity type, and is formed in the well, wherein the drain is located below the gate at another side of the gate away from the body region, wherein a drift region is located between the drain and the body region in a channel direction and the drift region serves as a drift current channel during the ON operation of the high voltage device;
   wherein a region where the body contact and the source overlaps with each other is defined as an overlap region, wherein the overlap region has the first conductivity type;
   wherein the body contact has a depth extending downward from an upper surface of the semiconductor layer, wherein the depth is deeper than a depth of the source extending downward from the upper surface of the semiconductor layer, so that a part of the body contact is located vertically below the overlap region;
   wherein a length of the overlap region in the channel direction is not shorter than a predetermined length, so as to suppress a parasitic bipolar junction transistor from being turned on when the high voltage device operates;
   wherein the parasitic bipolar junction transistor is formed by a part of the well, a part of the body region and a part of the source;
   wherein a concentration of the second conductivity type impurities of the body contact is higher than a concentration of the second conductivity type impurities of the body region.

2. The high voltage device of claim 1, further comprising a drift oxide region, which is formed above the upper surface and is in contact with the upper surface, and the drift oxide region is located above the drift region and in contact with the drift region, wherein the drift oxide region includes a local oxidation of silicon (LOCOS) structure, a shallow trench isolation (STI) structure, or a chemical vapor deposition (CVD) oxide region.

3. The high voltage device of claim 1, wherein the first conductivity type is opposite to the second conductivity type.

4. The high voltage device of claim 1, wherein the gate and the overlap region both extend in a width direction and are parallel with each other.

5. The high voltage device of claim 1, wherein the source is a single continuous region, whereas, the body contact includes plural separated sub-regions, wherein in the semiconductor layer beneath the upper surface, the plural sub-regions are separated from each other by the source, and each sub-region is surrounded by the source.

6. The high voltage device of claim 1, wherein the body contact includes plural separated sub-regions, wherein in the semiconductor layer beneath the upper surface, the plural sub-regions are separated from each other by the source, and a part of the overlap region is located right below a spacer layer of the gate.

7. A method for manufacturing a high voltage device, the method comprising:
   forming a semiconductor layer on a substrate;
   forming a well having a first conductivity type in the semiconductor layer;
   forming a body region having a second conductivity type in the well;
   forming a body contact having the second conductivity type in the body region, wherein the body contact is configured to operably serve as an electrical contact of the body region;
   forming a gate on the semiconductor layer, wherein a part of the body region is located vertically beneath and in contact with the gate, so as to provide an inversion current channel during an ON operation of the high voltage device;
   forming a source having the first conductivity type in the body region, wherein the source is located below the gate and out of one side of the gate; and
   forming a drain having the first conductivity type in the well, wherein the drain is located below the gate at another side of the gate away from the body region, wherein a drift region is located between the drain and the body region in a channel direction and the drift region serves as a drift current channel during the ON operation of the high voltage device;
   wherein a region where the body contact and the source overlaps with each other is defined as an overlap region, wherein the overlap region has the first conductivity type;
   wherein the body contact has a depth extending downward from an upper surface of the semiconductor layer, wherein the depth is deeper than a depth of the source extending downward from the upper surface of the semiconductor layer, so that a part of the body contact is located vertically below the overlap region;

wherein a length of the overlap region in the channel direction is not shorter than a predetermined length, so as to suppress a parasitic bipolar junction transistor from being turned on when the high voltage device operates;

wherein the parasitic bipolar junction transistor is formed by a part of the well, a part of the body region and a part of the source;

wherein a concentration of the second conductivity type impurities of the body contact is higher than a concentration of the second conductivity type impurities of the body region.

8. The method of claim 7, further comprising: forming a drift oxide region above the upper surface and in contact with the upper surface, wherein the drift oxide region is located above the drift region and in contact with the drift region, wherein the drift oxide region includes a local oxidation of silicon (LOCOS) structure, a shallow trench isolation (STI) structure, or a chemical vapor deposition (CVD) oxide region.

9. The method of claim 7, wherein the first conductivity type is opposite to the second conductivity type.

10. The method of claim 7, wherein the gate and the overlap region both extend in a width direction and are parallel with each other.

11. The method of claim 7, wherein the source is a single continuous region, whereas, the body contact includes plural separated sub-regions, wherein in the semiconductor layer beneath the upper surface, the plural sub-regions are separated from each other by the source, and each sub-region is surrounded by the source.

12. The method of claim 7, wherein the body contact includes plural separated sub-regions, wherein in the semiconductor layer beneath the upper surface, the plural sub-regions are separated from each other by the source, and a part of the overlap region is located right below a spacer layer of the gate.

* * * * *